(12) United States Patent
Bedell

(10) Patent No.: US 7,994,886 B2
(45) Date of Patent: Aug. 9, 2011

(54) FAULT TOLERANT SOLID STATE PUSH BUTTON CONTROL SYSTEM WITH BUILT IN DIAGNOSTIC

(75) Inventor: Jeffrey Clark Bedell, Woodinville, WA (US)

(73) Assignee: Korry Electronics Co., Seattle, WA (US)

( * ) Notice: Subject to any disclaimer, the term of this patent is extended or adjusted under 35 U.S.C. 154(b) by 1118 days.

(21) Appl. No.: 11/750,228

(22) Filed: May 17, 2007

(65) Prior Publication Data

US 2008/0284549 A1     Nov. 20, 2008

(51) Int. Cl.
*H01H 9/00*     (2006.01)
*H03M 1/22*     (2006.01)
*G08C 19/16*     (2006.01)
*G01B 7/14*     (2006.01)

(52) U.S. Cl. ........ 335/205; 335/177; 335/206; 335/207; 335/306; 341/9; 341/15; 340/870.01; 324/207.2

(58) Field of Classification Search .......... 335/151–153, 335/167–184, 205–207, 302; 324/207.4, 324/207.2, 207.22, 207.21, 207.24, 207.25, 324/235, 251, 252; 340/825.07, 825.06, 340/825.52, 825.31, 825.34, 825.22, 825.57, 340/825.62, 825.65, 870.01; 307/116, 125, 307/131, 139, 140, 413, 415; 341/9, 10–15, 341/96, 116, 171; 338/32 H, 32 R
See application file for complete search history.

(56) References Cited

U.S. PATENT DOCUMENTS

| | | | |
|---|---|---|---|
| 3,461,449 A * | 8/1969 | Rittenhouse et al. | 341/9 |
| 3,768,094 A * | 10/1973 | Henrich | 341/15 |
| 3,783,430 A * | 1/1974 | Nishiba et al. | 338/32 H |
| 3,848,216 A | 11/1974 | Gamble | |
| 3,848,252 A | 11/1974 | Chang et al. | |
| 3,858,145 A | 12/1974 | Sulich et al. | |
| 4,054,860 A | 10/1977 | Henderson et al. | |
| 4,054,861 A | 10/1977 | Markison | |
| 4,061,988 A | 12/1977 | Lewandowski | |
| 4,156,820 A | 5/1979 | Fukuda et al. | |
| 4,176,782 A * | 12/1979 | Fukuda et al. | 235/449 |
| 4,203,093 A | 5/1980 | Edwards | |
| 4,359,719 A | 11/1982 | Schwarzer | |
| 4,489,303 A | 12/1984 | Martin | |
| 4,673,827 A | 6/1987 | Sommer | |
| 4,728,928 A | 3/1988 | Shipley | |
| 4,733,177 A * | 3/1988 | Pawletko | 324/207.21 |
| 4,779,075 A * | 10/1988 | Zagelein et al. | 340/870.18 |
| 4,791,257 A | 12/1988 | Frey et al. | |
| 4,829,248 A | 5/1989 | Loubier | |
| 5,029,304 A | 7/1991 | Tolmie, Jr. | |
| 5,045,920 A | 9/1991 | Vig et al. | |
| 5,192,877 A | 3/1993 | Bittebierre et al. | |
| 5,519,393 A * | 5/1996 | Brandestini | 341/10 |
| 5,670,886 A | 9/1997 | Wolff et al. | |
| 5,747,986 A * | 5/1998 | Hristoforou | 324/207.13 |
| 5,790,046 A | 8/1998 | Blossfeld | |

(Continued)

*Primary Examiner* — Anh T Mai
*Assistant Examiner* — Mohamad A Musleh
(74) *Attorney, Agent, or Firm* — Seed Intellectual Property Law Group PLLC

(57) ABSTRACT

A contactless switch module, which is actuatable between a closed circuit position and an open circuit position, a plurality of magnetic field sensing sensors, and a plurality of magnets. The switch also includes a multi-channel switch controller. Each one of the plurality of magnetic field sensing sensors is communicatively coupled to an input channel of the multi-channel switch controller. The multi-channel switch controller is configured to determine a switch state based at least upon the respective states of its input channels.

34 Claims, 12 Drawing Sheets

U.S. PATENT DOCUMENTS

| | | |
|---|---|---|
| 5,861,796 A | 1/1999 | Benshoff |
| 5,936,319 A * | 8/1999 | Chitayat .................... 310/12.01 |
| 5,955,881 A * | 9/1999 | White et al. .............. 324/207.2 |
| 6,097,272 A | 8/2000 | Grover et al. |
| 6,274,953 B1 * | 8/2001 | Hwang et al. ............. 310/12.19 |
| 6,494,409 B1 | 12/2002 | Franke |
| 6,566,619 B2 | 5/2003 | Gillman et al. |
| 6,588,710 B1 * | 7/2003 | Taylor ........................... 246/220 |
| 6,777,928 B2 | 8/2004 | Ramirez |
| 6,867,582 B2 | 3/2005 | Muraji et al. |
| 6,867,680 B1 | 3/2005 | Kulle |
| 6,940,275 B2 | 9/2005 | Sogge |
| 7,009,386 B2 | 3/2006 | Tromblee et al. |
| 7,088,096 B2 | 8/2006 | Etherington et al. |
| 2002/0153993 A1 | 10/2002 | Inada et al. |
| 2008/0174301 A1 * | 7/2008 | Mattson .................... 324/207.2 |

\* cited by examiner

FAULT TOLERANT SOLID STATE PUSH BUTTON CONTROL SYSTEM WITH BUILT IN DIAGNOSTIC

BACKGROUND

1. Field

This disclosure is generally related to the field of solid state control systems and, more particularly, to the fault tolerant solid state control systems.

2. Description of the Related Art

Contactless switches are frequently used in control panel assemblies of vehicles such as airplanes. A control panel may include a plurality of switches that are in communication with a variety of electrical or hydraulic systems. In a typical system, actuation of the switch produces a relatively low current output to activate the switching action of a larger driver circuit. Such driver circuits are used to actuate a variety of systems, such as the landing gear or running lights of the vehicle.

Switches currently available for such systems include both contact and contactless switches. Contact switches include gold-plated leaf springs that may be actuated into and out of physical contact with the driver circuit. Typically, these switches include a tactile response to indicate when the switch changes state.

Contactless switches generally include a magnet and a sensor that is sensitive to magnetic forces to produce electronic control pulses. In a typical contactless switch, the magnets are permanently mounted to a device that is either rotated or linearly translated into close proximity with the sensors to change the state of the switch.

Contactless switches are well known. For example, U.S. Pat. No. 6,867,680 issued to Kulle discloses a contactless switch having a Hall effect sensor and dual magnets mounted on a magnet carrier. The magnets are arranged to have opposite magnetic poles facing the Hall effect sensor. When the switch is actuated, the magnet carrier and magnets mounted thereon are displaced relative to the Hall effect sensor. The positional displacement of the magnets relative to the Hall effect sensor alters the magnetic field detected by the Hall effect sensor. When the magnetic field detected by the Hall effect sensor reaches a predetermined level, the switch is actuated.

A problem with current contactless switches employing one or more Hall effect sensors is that the state of the contactless switch may change if one or more of the Hall effect sensors malfunctions.

Thus, there exists a need for a contactless switch that is not only tolerant of malfunctions, but is also economical to manufacture, has a high degree of reliability and meets the performance expectations of the end user.

BRIEF SUMMARY

In one aspect, a contactless switch module includes a plurality of magnets, a plurality of latching magnetic field sensing sensors, an actuator, and a multi-channel switch controller. The actuator may be selectively operable to produce relative movement between the plurality of latching magnetic field sensing sensors and the plurality of magnets in response to manipulation by a user such that each of the latching magnetic field sensing sensors is proximal to a first respective one of the magnets when the actuator is in a first position and each of the latching magnetic field sensing sensors is proximal to a second respective one of the magnets when the actuator is in a second position, different from the first position. The multi-channel switch controller has a plurality of input channels, each one of the plurality of magnetic field sensing sensors communicatively coupled to at least one of the plurality of input channels. The multi-channel switch controller may be configured to determine a respective current channel state for each one of the input channels, the current channel states being related to current sensor states of the plurality of magnetic field sensing sensors, and may be further configured to find a current switch state based at least upon the current channel states and a logic.

In another aspect, a contactless switch module includes an actuator, a plurality of sensor comparators, and a multi-channel switch controller. The actuator may be selectively operable to produce relative movement between a plurality of latching magnetic field sensing sensors and a plurality of magnets in response to manipulation by a user such that each of the latching magnetic field sensing sensors is proximal to a first respective one of the magnets when the actuator is in a first position and each of the latching magnetic field sensing sensors is proximal to a second respective one of the magnets when the actuator is in a second position, different from the first position. Each one of the plurality of sensor comparators has a plurality of input channels, and each of the plurality of latching magnetic field sensing sensors communicatively coupled to at least one input channel of at least one sensor comparator. Each sensor comparator may be configured to determine a respective current sensor state for each one of the input channels, and each sensor comparator may be further configured to find a current combined state based at least upon the current sensor states and a first logic. The multi-channel switch controller has a plurality of input channels, and each one of the sensor comparators is communicatively coupled to at least one of the plurality of input channels. The multi-channel switch controller may be configured to determine a respective current channel state for each one of the input channels, the current channel states being related to current combined states of the plurality of sensor comparators, and the multi-channel switch controller may be further configured to find a current switch state based at least upon the current channel states and a second logic.

In another aspect, a contactless switch module includes a first plurality of permanent magnets, each permanent magnet having a magnetic north pole and a magnetic south pole, a magnet carrier carrying the first plurality of permanent magnets, each of the first plurality of permanent magnets arranged to have a magnetic pole exposed from the magnet carrier, wherein the magnetic polarity of each of the exposed magnetic poles is the same. The contactless switch module further includes a first set and a second set of latching magnetic field sensing sensors and an actuator selectively operable to produce relative movement between the first and second sets of latching magnetic field sensing sensors and the magnet carrier in response to manipulation by a user such that each latching magnetic field sensing sensor of the first set of latching magnetic field sensors is proximal to a first respective one of the first plurality of magnets when the actuator is in a first position and each latching magnetic field sensing sensor of the second set of the latching magnetic field sensing sensors is proximal to a second respective one of the first plurality of magnets when the actuator is in a second position, different from the first position. The contactless switch module further includes a multi-channel switch controller having a plurality of input channels, each one of the plurality of magnetic field sensing sensors communicatively coupled to at least one of the plurality of input channels, the multi-channel switch controller configured to determine a respective current channel state for each one of the input channels, the current channel states being related to current sensor states of the first and second sets of magnetic field sensing sensors, the multi-channel switch controller further configured to find a current switch state based at least upon the current channel states and a first logic.

BRIEF DESCRIPTION OF THE SEVERAL VIEWS OF THE DRAWING(S)

FIG. 11 is a flow diagram showing a second process to find a switch state according to one illustrated embodiment.

DETAILED DESCRIPTION

Figure 1:
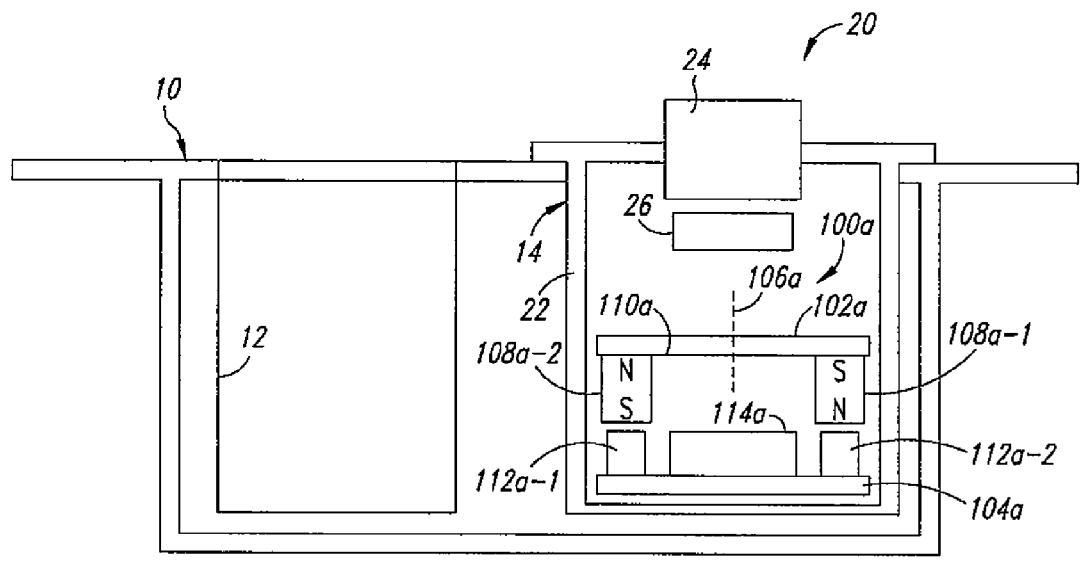
FIG. 1 is a schematic side view of a control panel assembly and a switch having a contactless switch assembly according to one illustrated embodiment.

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with switches and the like have not been shown or described in detail to avoid unnecessarily obscuring descriptions of the embodiments.

Unless the context requires otherwise, throughout the specification and claims which follow, the word "comprise" and variations thereof, such as "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the terms "and" and "or" are generally employed in the sense including "and/or" unless the content clearly dictates otherwise.

The headings and Abstract of the Disclosure provided herein are for convenience only and do not interpret the scope or meaning of the embodiments.

FIG. 1 shows a control panel assembly (CPA) 10 that provides an interface for a flight crew of an aircraft with, among other things, electronic and hydraulic systems for the aircraft according to one illustrated embodiment.

The CPA 10 is configured to be modularly integrated with a control panel of the aircraft. In particular, the CPA 10 may be configured to have pre-determined dimensions (width, length, depth) and configured to have electrical connectors (not shown) such that the CPA 10 can be easily inserted into and/or removed from the control panel and easily connected to electronic systems of the aircraft. Because there is very little free space under the control panel of most aircraft, the CPA 10 has a low profile, e.g., the depth is approximately three inches or less, so that the CPA 10 does not interfere with wiring and other components under the control panel. Typically, the CPA 10 includes multiple user-interface receiving locations 12 and 14. The user-interface receiving location 12 is shown as being empty. The user-interface receiving location 12 may be filled by a user-interface when, for example, the electronic systems of the aircraft are updated. The user-interface receiving location 14 has a switch module 20 mounted therein, which may be removably mounted to the CPA 10.

The switch module 20 has a low profile (e.g., having a depth of approximately three or less inches) and includes a housing 22 and a actuator 24 extending outward of an exterior of the CPA 10, towards a user. The user may actuate the actuator 24 to move between various positions, for example to move between a closed circuit position and open circuit position. In some embodiments, the actuator 24 may include a button, toggle, lever, knob, etc. The user may actuate the actuator 24 by pressing, depressing, rotating, toggling, flipping, touching, or otherwise moving, or otherwise engaging the actuator 24.

The switch module 20 includes a mechanical driver assembly 26 and a contactless switch assembly 100a, both of which are enclosed by the housing 22. The mechanical driver 26 interfaces between the actuator 24 and the contactless switch assembly 100a. When the actuator 24 is actuated (e.g., pressed, depressed, rotated, toggled, flipped, etc.), the mechanical driver assembly 26 engages the contactless switch assembly 100a to cause the contactless switch assembly 100a to switch between an open circuit position and a closed circuit position. The mechanical driver assembly 26 includes well-known mechanical components such as springs, guides, etc. For example, U.S. Pat. No. 6,097,272 describes a contactless switch having components and assemblies that cause relative motion between Hall effect sensors and permanent magnets disposes in a housing in response to user actuation.

The contactless switch assembly 100a includes a magnet carrier 102a and a sensor holder 104a, such as a printed wiring board or the like. The magnet carrier 102a and sensor holder 104a are configured to move relative to each other in response to actuation of the actuator 24. As will be described in detail below, in some embodiments, the relative motion may be rotational or translational. For the sake of simplicity, the relative motion between the magnet carrier 102a and sensor holder 104a will be described in terms of the magnet carrier 102a rotating by a set amount about a rotation axis 106a. However, in some embodiments, the sensor holder 104a may rotate about the axis 106a. The magnet carrier 102a and the sensor holder 104a are stacked such that they are vertically offset along the rotation axis 106a (e.g., into and out of the page with respect to FIG. 1).

The magnetic carrier 102a includes permanent magnets, individually referenced as 108a-1 and 108a-2 and collectively referenced as 108a. The permanent magnets 108a are carried on a surface 110a of the magnet carrier 102a in a determined arrangement, such as at opposite ends of the magnet carrier 102a or in a determined fashion about the rotational axis 106a.

The sensor holder 104a includes a pair of latching magnetic field sensing sensors such as reed sensors or Hall effect sensors, individually referenced as 112a-1 and 112a-2 and collectively referenced as 112a. The latching magnetic field sensing sensors 112a are disposed on the sensor holder 104a in an arrangement that is complementary to the permanent magnets 108a. Table 1 shows the states of a latching bi-directional Hall effect sensor and a latching programmable Hall effect sensor.

TABLE 1

Sensor states for latching bi-directional and programmable Hall effect sensors

| Bi-Directional Sensor Input | Sensor State Output | Programmable Sensor Input | Sensor State Output |
|---|---|---|---|
| Magnetic North Pole $\vec{B}_1 = \vec{B}_0$ | 1 | $\vec{B}_1 = \vec{B}_0$ | 1 |
| Magnetic South Pole $\vec{B}_2 = -\vec{B}_0$ | 0 | $\vec{B}_2 \neq -\vec{B}_0$ | 0 |

For the sake of clarity, the latching magnetic field sensing sensors 112a are referred to and described below as latching bi-directional Hall effect sensors that switch in the presence of magnetic fields corresponding to $\vec{B}_1$ and $\vec{B}_2$, where the fields $\vec{B}_1$ and $\vec{B}_2$ are anti-parallel and have the same magnitude $\vec{B}_0$. However, in some embodiments, the latching magnetic field sensing sensors 112a may be, but not limited to, reed sensors or programmable Hall effect sensors such that the detected magnetic fields at the switching points ($\vec{B}_1$ and $\vec{B}_2$) are non-complementary. For example, the programmable Hall effect sensors could be programmed to switch at $\vec{B}_1=\vec{B}_0$ and $\vec{B}_2=0$ or $\vec{B}_1=\vec{B}_0$ and $\vec{B}_2=-0.5\vec{B}_0$. The switching of the Hall effect sensors in the presence of complementary magnetic fields is a non-limiting example provided for the sake of clarity.

The contactless switch assembly 100a includes a multi-channel switch controller 114a, which is electrically coupled to the latching Hall effect sensors 112a. As shown in FIG. 1, the latching Hall effect sensor 112a-1 detects the magnetic south pole of the permanent magnet 108a-2 and is latched into the sensor state of S=0. Whereas, the latching Hall effect sensor 112a-2 detects the magnetic north pole of the permanent magnet 108a-1 and is latched into the sensor state of S=1. The multi-channel switch controller 114a produces a switch state (SS) based upon the sensor states.

As will be shown in detail below, the permanent magnets 108a and the latching Hall effect sensors 112a move relative to each other when the actuator 24 is actuated. The relative motion between the permanent magnets 108a and the latching Hall effect sensors 112a cause each of the latching Hall effect sensors 112a to detect a different permanent magnet 108, which causes the latching Hall effect sensor to flip sensor states. Flipping the sensor states for each of the latching Hall effect sensors results in the multi-channel switch controller 114a changing the switch state.

Figure 2:
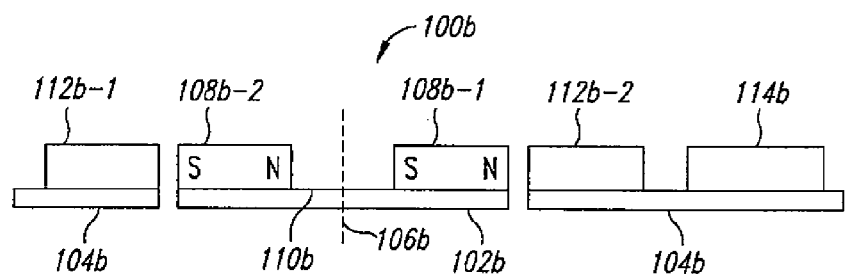
FIG. 2 is a schematic side view of a contactless switch assembly according to a second illustrated embodiment.

Stacking the magnetic holder 102a and the sensor holder 104a is merely one possible configuration for the contactless switch assembly 100a. FIG. 2 represents a second possible configuration of a contactless switch assembly 100b. In FIG. 2, the various labels having both a reference numeral and a letter "b" identify components and/or features that are similar in at least some respects as those shown in FIG. 1 that are labeled with the same reference numeral and the letter "a." The detailed description of such components are initially provided with respect to the embodiment of FIG. 1 and, for the sake of brevity, the description of such components in the context of their subsequent "b" labeled counterparts in FIG. 2 are abbreviated or omitted.

In FIG. 2, the latching Hall effect sensors 112b-1 and 112b-2 are aligned in a plane with the permanent magnets 108b-1 and 108b-2. The magnet carrier 102b is configured to rotate about the rotational axis 106b (e.g., into and out of the page with respect to FIG. 2). In FIG. 2, the latching Hall effect sensor 112b-1 is proximal to the permanent magnet 108b-2 and detects the magnetic south pole of the permanent magnet 108b-2. Similarly, the latching Hall effect sensor 112b-2 detects the magnetic north pole of the permanent magnet 108b-1.

When the actuator 24 is actuated, the permanent magnets 108b and the latching Hall effect sensors 112b move relative to each other. The relative motion between the permanent magnets 108b and the latching Hall effect sensors 112b cause each of the latching Hall effect sensors 112b to detect a different permanent magnet 108, which causes the latching Hall effect sensor to flip sensor states. Flipping of the sensor states for each of the latching Hall effect sensors results in the multi-channel switch controller 114b changing the switch state.

FIGS. 3A-9B show various embodiments of contactless switch assemblies, which are labeled 100c-100i, respectively. The following embodiments are non-limiting and are provided for the sake of clarity. In the following figures and descriptions thereof, various labels having reference numeral with a letter (such as c, d, e, . . . , i) identify components and/or features that are similar in at least some respects as those of FIG. 1 that are labeled with the same reference numeral and the letter "a." The detailed description of such components are initially provided with respect to the embodiment of FIG. 1 and, for the sake of brevity, the description of such components in the context of their subsequently labeled counterparts in the subsequent FIGS. 3A-9B are abbreviated or omitted. For example, three electrical connectors 118c, 120c, and 122c are initially discussed in connection with FIGS. 3A and 3B and are labeled in subsequent figures as 118d, 118e, 118f, 118g, 118h, 118i; 120d, 120e, 120f, 120g, 120h, 120i; and 122d, 122e, 122f, 122g, 122h, 122i. It should be noted that the contactless switch assemblies having rotational relative motion between the respective magnet carriers and sensor holders may include permanent magnets and latching Hall effect sensors that are stacked in a manner similar to that shown in FIG. 1 and/or include permanent magnets and latching Hall effect sensors that are aligned in a manner similar to that shown in FIG. 2. Further, it should be noted that relative motion between Hall effect sensors and permanent magnets might be through translational motion in some of the following embodiments.

Figure 3A:
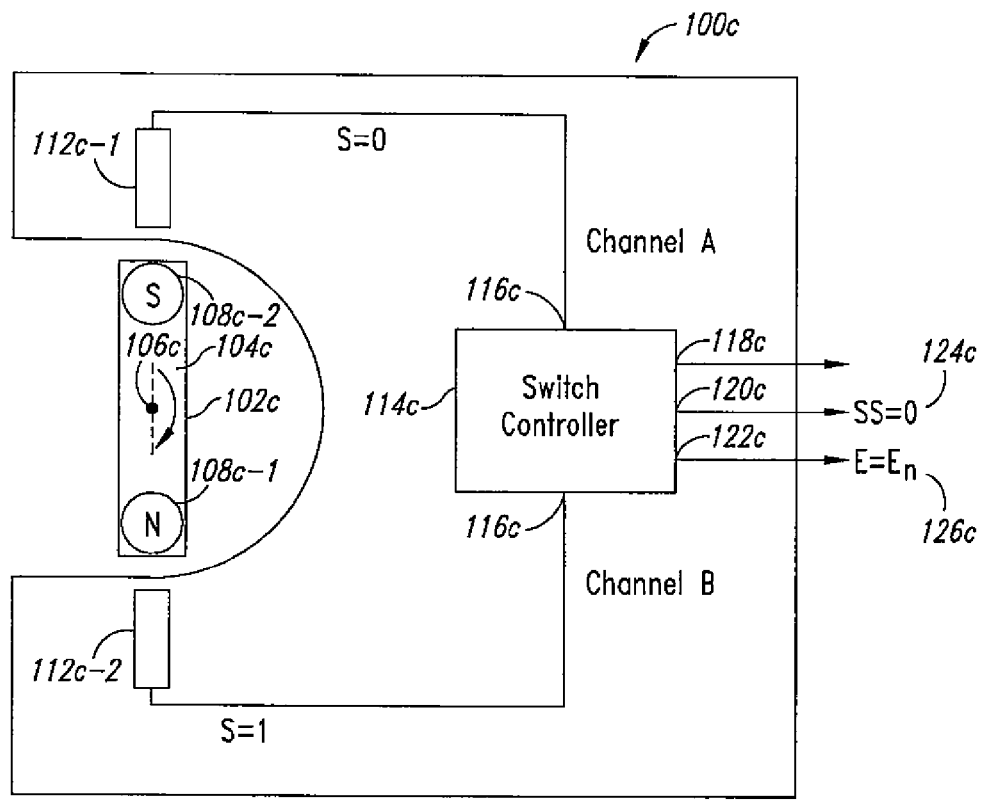
FIGS. 3A and 3B are block diagrams of a contactless switch assembly in open circuit position and closed circuit positions, respectively, according to a third illustrated embodiment.
Figure 3B:
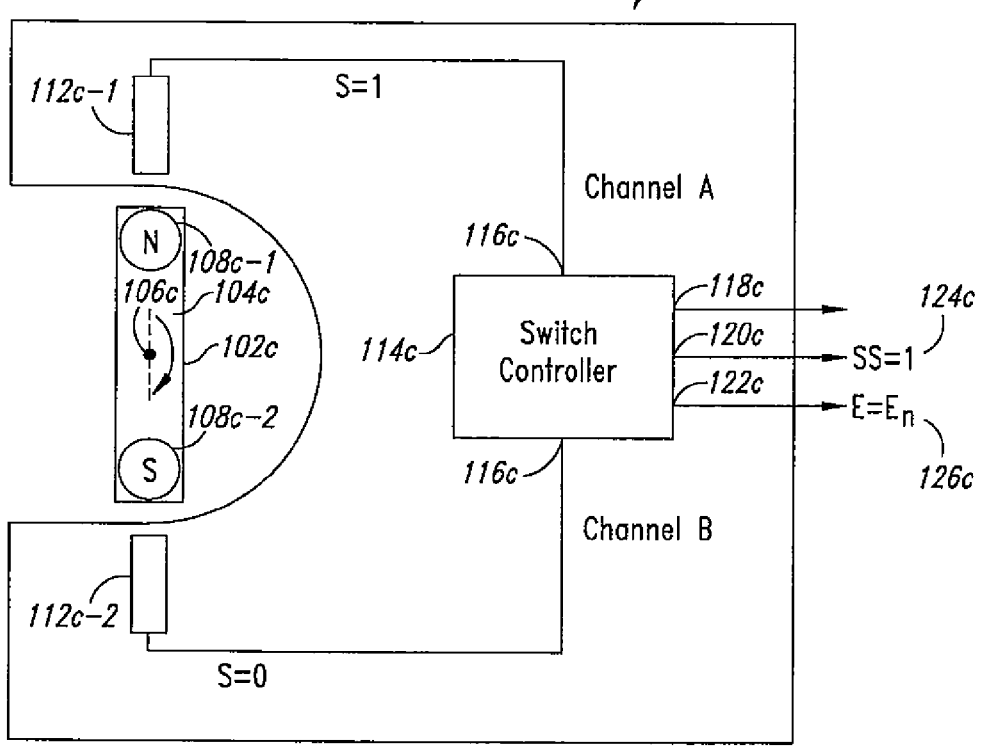

FIGS. 3A and 3B show a third embodiment of a contactless switch assembly 100c in open position and closed circuit positions, respectively. This embodiment may be the simplest embodiment having the fewest components. However, many of the principles described in this embodiment may be applied to subsequent embodiments described below.

The contactless switch assembly 100c has a pair of permanent magnets 108c and a pair of latching Hall effect sensors 112c. In this embodiment, when the actuator 24 is actuated, the relative motion between the magnet carrier 102c and the sensor holder 104c is 180 degrees about the rotational axis 106c.

As shown in FIG. 3A, when the contactless switch assembly 100c is in the open circuit position, the latching Hall effect sensor 112c-1 detects the magnetic south pole of the permanent magnet 108c-2, and the latching Hall effect sensor 112c-2 detects the magnetic north pole of the permanent magnet 108c-1. FIG. 3B shows the state of the contactless switch assembly 100c after the actuator 24 is actuated, such that the magnetic carrier 102c rotates 180° relative to the sensor holder 104c. In FIG. 3B, the contactless switch assembly 100c is in the closed circuit position and the latching Hall effect sensor 112c-1 detects the magnetic north pole of the permanent magnet 108c-1, and the latching Hall effect sensor 112c-2 detects the magnetic south pole of the permanent magnet 108c-2.

The switch multi-controller 114c has two input channels, individually referenced as Channel A and Channel B and collectively referenced as channels 116c, and three electrical connectors 118c, 120c, and 122c. The electrical connector 118c is in electrical communication with a power source (not shown) that provides electrical power to the contactless switch assembly 100c via the electrical connector 118c. The electrical connectors 120c and 122c may be used to provide a switch state (SS) indicator 124c and a switch error level indicator 126c, respectively. In some embodiments, the number of electrical connectors may be fewer or more.

The multi-channel switch controller 114c generates the switch state indicator 124c based upon states of channels 116c. The multi-channel switch controller 114c uses selection rules, or a truth table, for determining the value of switch state indicator 124. As shown in FIGS. 3A and 3B, the multi-channel switch controller 114c provides, via electrical connector 120c, the switch state indicator 124c of SS=0 corresponding to the open circuit position of the contactless switch assembly 100c and the switch state indicator 124c of SS=1 corresponding to the open circuit position of the contactless switch assembly 100c.

An exemplary truth table for multi-channel switch controller 114c is shown in Table 2.

TABLE 2

Truth table for 2-channel switch controller

| Input | | Switch State | Switch Error Level |
|---|---|---|---|
| Channel A | Channel B | Indicator 124c | Indicator 126c |
| 0 | 0 | 0 | $E_1$ |
| 0 | 1 | 0 | $E_0$ |
| 1 | 0 | 1 | $E_0$ |
| 0 | 0 | 1 | $E_1$ |

Under normal operating conditions, the latching Hall effect sensors 112c will detect the opposite magnetic poles of the permanent magnets 108c, and based upon Table 1, the latching Hall effect sensors will have opposite respective sensor states. When the switch module 20 is in the open circuit position, the respective states of Channels A and B are 0 and 1, and the switch state indicator 124c is SS=0 with a switch error level indicator 126c of $E_0$. Similarly, when the switch module 20 is actuated, the respective states of Channels A and B are 1 and 0, and the switch state indicator 124c is SS=1 with a switch error level indicator 126c of $E_0$.

The remaining channel states of (0,0) and (1,1) are not possible under normal operating conditions. However, one or both of the latching Hall effect sensors 112c may malfunction, thereby producing an erroneous state, or one or both of the latching Hall effect sensors 112c may detect an external magnetic field that swamps the latching Hall effect sensor, thereby producing an erroneous state. The multi-channel switch controller 114c may use Table 2 to provide a switch state 124c and an error level indicator 126c based upon the states of Channel A and Channel B.

In some embodiments, the multi-channel switch controller 114c may be configured to change the switch state indicator 124c only if the switch error level indicator 126c is $E_0$. When configured as such, the multi-channel switch controller 114c will not inadvertently change the switch state indicator 124c in response to the latching Hall effect sensors 112c being swamped by an external magnetic field or by one or both of the latching Hall effect sensors 112c malfunctioning.

Figure 4A:
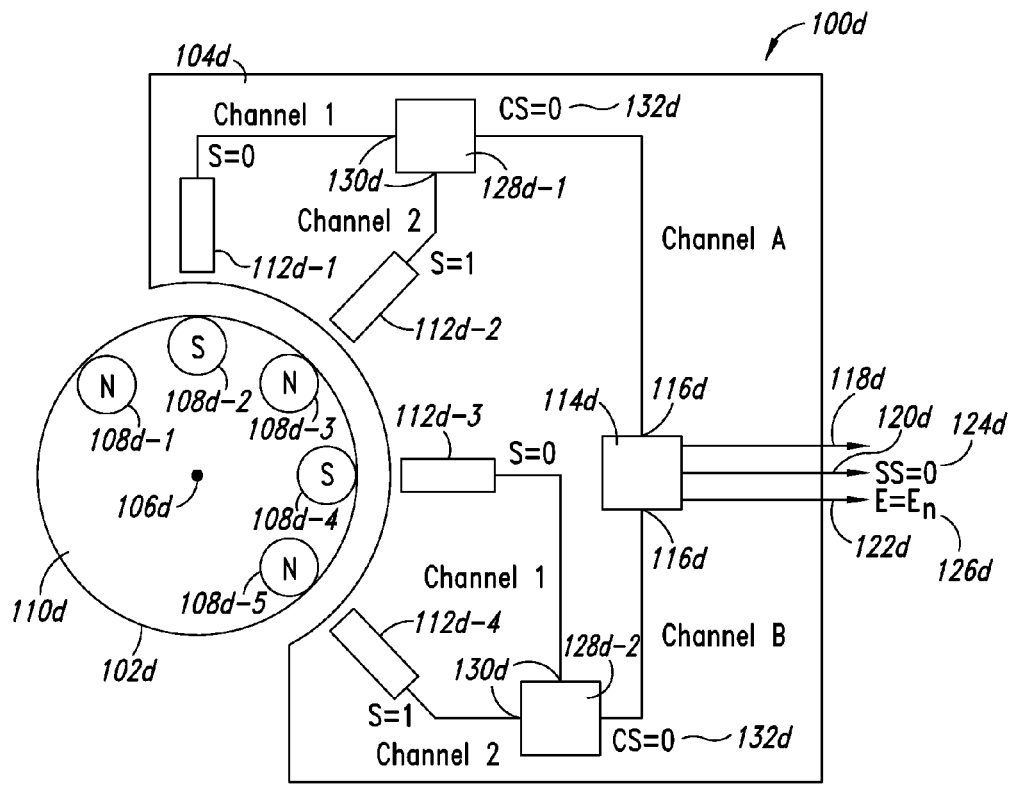
FIGS. 4A and 4B are block diagrams of a contactless switch assembly in open circuit position and closed circuit positions, respectively, according to a fourth illustrated embodiment.
Figure 4B:
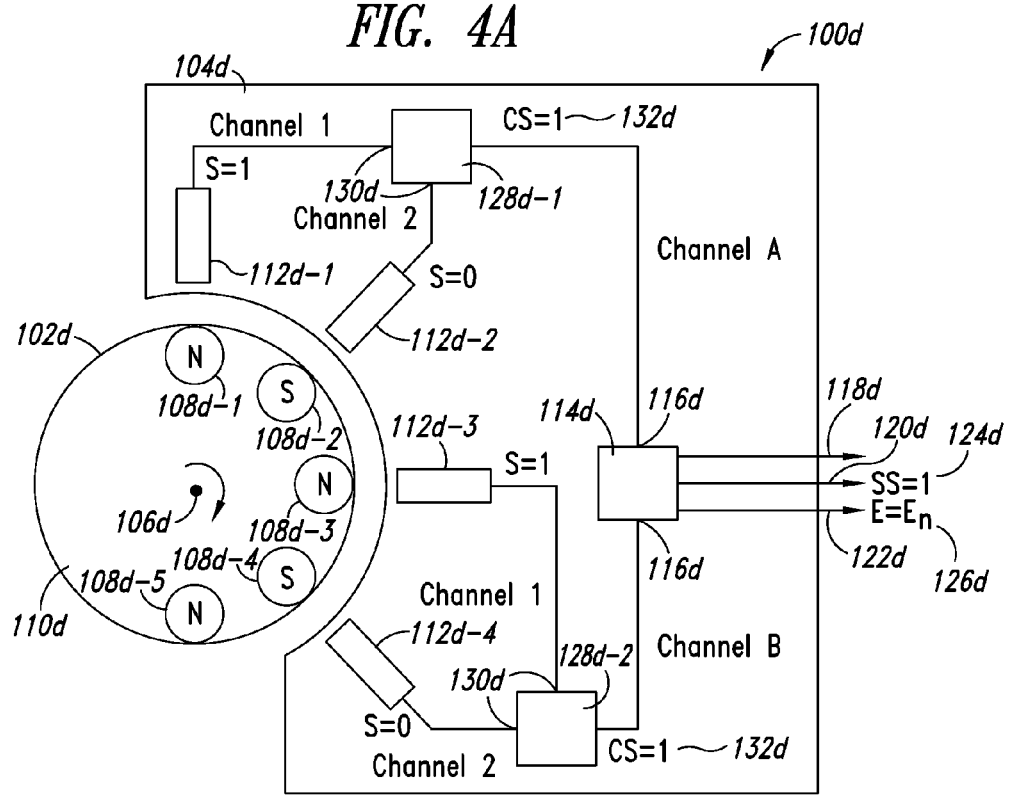

FIGS. 4A and 4B show a fourth embodiment of a contactless switch assembly 100d. In this embodiment, the relative motion between the magnet carrier 102d and sensor holder 104d is a set amount of rotation about the axis 106d such as 45°.

In this embodiment, the contactless switch assembly 100d includes a pair of sensor comparators, individually referenced as 128d-1 and 128d-2 and collectively referenced as 128d. The sensor comparator 128d-1 is connected to two latching Hall effect sensors 112d-1 and 112d-2 via input channels, individually referenced as Channel 1 and Channel 2 and collectively referenced as 130d. Similarly, the sensor comparator 128d-2 is connected to two latching Hall effect sensors 112d-3 and 112d-4 via input channels, individually referenced as Channel 1 and Channel 2 and collectively referenced as 130d. Each of the sensor comparators 128d-1 and 128d-2 generates a combined sensor (CS) state 132d based upon states of Channels 1 and 2 and a truth table. Each one of the combined sensor (CS) states 132d are provided to the multi-channel switch controller 114d via the input channels 116d.

An exemplary truth table for the sensor comparators 128*d* is shown in Table 3 and may be used by sensor comparators in embodiments described below.

TABLE 3

Truth table for sensor comparators of
FIGS. 4A, 4B, 6A, 6B, 8A and 8B

| | Input | | Output |
|---|---|---|---|
| | Channel 1 | Channel 2 | (CS) State 132 |
| 1 | 0 | 0 | e_ss |
| 2 | 0 | 1 | 0 |
| 3 | 1 | 0 | 1 |
| 4 | 1 | 1 | e_nn |

The rows 2 and 3 show the states of Channels 1 and 2 of the sensor comparators 128*d* under normal operating conditions. When the switch module 20 is open circuit position, the combined sensor state 132 has a value of CS=0, and when the switch module 20 is actuated, the combined sensor state 132 is CS=1, as shown in FIGS. 4A and 4B, respectively.

In the configuration shown in FIGS. 4A and 4B, under normal operating conditions, the states of Channels 1 and 2, as shown in rows 1 and 4 are not possible. These states are most likely due to external magnetic fields swamping the latching Hall effect sensors 112*d* or by at least one of the latching Hall effect sensors 112*d* malfunctioning. The combined sensor state 132*d* may have a value such as CS=e_ss to signify that Channel 1 and Channel 2 of the sensor comparator 128*d* are both in sensor state (S=0), i.e., both latching Hall effect sensors 112*d* are detecting magnetic south poles. Similarly, the combined sensor state 132 may have a value such as CS=e_nn to signify that Channel 1 and Channel 2 of the sensor comparator 128*d* are both in sensor state (S=1), i.e., both latching Hall effect sensors 112*d* are detecting magnetic north poles.

The multi-channel switch controller 114*d* generates the switch state indicator 124*d* and the switch error level indicator 126*d* based upon a switch state truth table and the combined sensor states 132*d* received via Channels A and B, i.e, based upon the states of Channels A and B. Table 4 is an exemplary switch state truth table that the multi-channel switch controller 114*d* may implement.

TABLE 4

Switch Truth Table for 2-channel switch controller 114d

| | Channel A | Channel B | Switch State Indicator 124 | Switch Error Level Indicator 126 |
|---|---|---|---|---|
| 1 | e_ss | e_ss | SS = x (x) | E = $E_2$ |
| 2 | e_ss | 0 | SS = x (0) | E = $E_1$ |
| 3 | e_ss | 1 | SS = x (1) | E = $E_1$ |
| 4 | e_ss | e_nn | SS = x (x) | E = $E_2$ |
| 5 | 0 | e_ss | SS = x (0) | E = $E_1$ |
| 6 | 0 | 0 | SS = 0 (0) | E = $E_0$ |
| 7 | 0 | 1 | SS = x (x) | E = $E_2$ |
| 8 | 0 | e_nn | SS = x (0) | E = $E_1$ |
| 9 | 1 | e_ss | SS = x (1) | E = $E_1$ |
| 10 | 1 | 0 | SS = x (x) | E = $E_2$ |
| 11 | 1 | 1 | SS = 1 (1) | E = $E_0$ |
| 12 | 1 | e_nn | SS = x (1) | E = $E_1$ |
| 13 | e_nn | e_ss | SS = x (x) | E = $E_2$ |
| 14 | e_nn | 0 | SS = x (0) | E = $E_1$ |
| 15 | e_nn | 1 | SS = x (1) | E = $E_1$ |
| 16 | e_nn | e_nn | SS = x (x) | E = $E_2$ |

The switch truth table shown in Table 3 is based upon the configuration of the permanent magnets 108*d* and the sensor comparator truth table as shown in Table 3. Here, row 6 represents the switch module 20 in open circuit position under normal operating conditions, and row 11 represents the switch module 20 in closed circuit position under normal operating conditions. In all of the rows except rows 6 and 11, there is at least one error in either the state of Channel A or Channel B or in both Channels A and B. For example, rows 1 and 16 correspond to when all of the latching Hall effect sensors 112*d* detect a south magnetic pole and a north magnetic pole, respectively. The various switch state indicators 124 and various switch error level indicators 126 may be used for diagnostic purposes. The value of "x" may be arbitrary or different from either 0 or 1 or there may be set values for different switch error levels. Here a switch error level of $E_0$ signifies that all input Channels A and B are error free, a switch error level of $E_1$ signifies an error in either Channel A or B, and a switch error level of $E_2$ signifies errors in both Channel A and Channel B.

In some embodiments, the switch state indicator 124 might be set to the values shown in parentheses in Table 3. When there is a switch error level of 2, the switch state indicator 124 is set to "x", x may be an arbitrary value, or predetermined value, or predetermined value that is corresponding to a channel state. When there is a switch error level of 1, the switch state indicator 124 is set to the state of the valid input channel. For example, row 5 corresponds to the combined sensor state of the sensor comparator 128*d*-1 having a value of 0, which is a valid state of the sensor comparator 128*d*-1, and the combined sensor state of the sensor comparator 128*d*-2 being in an error state corresponding to both of the latching Hall effect sensors 112*d*-3 and 112*d*-4 detecting magnetic south poles, which cannot occur during normal operation. Therefore, the multi-channel switch controller 114*d* may set the switch state indicator to the value of 0.

Figure 5A:
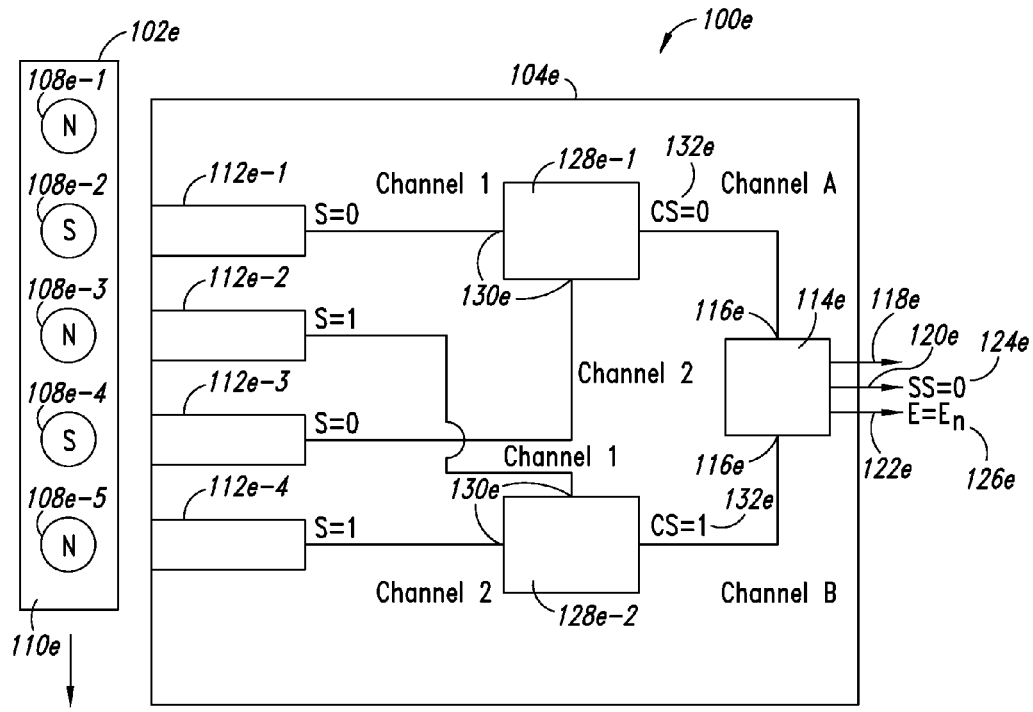
FIGS. 5A and 5B are block diagrams of a contactless switch assembly in open circuit position and closed circuit positions, respectively, according to a fifth illustrated embodiment.
Figure 5B:
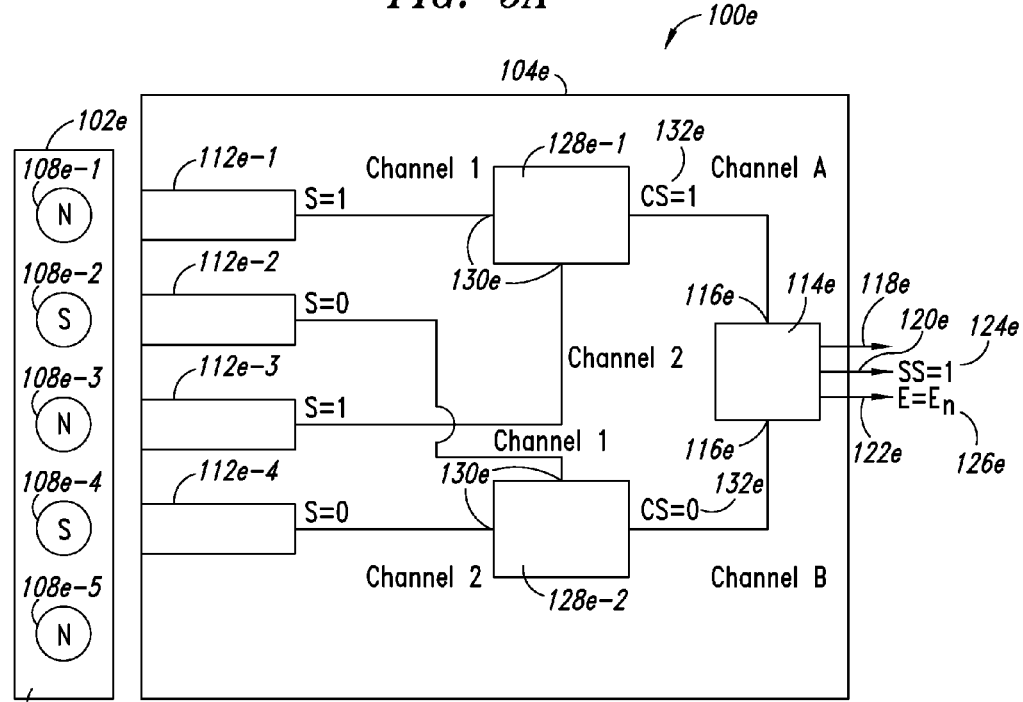

FIGS. 5A and 5B show a fifth embodiment of a contactless switch assembly 100*e* in open circuit and closed circuit positions, respectively. In this embodiment, the relative motion between the magnet carrier 102*e* and sensor holder 104*e* is translational.

The magnet carrier 102*e* has five permanent magnets 108*e*-1 through 108*e*-5. The permanent magnets 108*e* are arranged to have alternating magnetic poles exposed toward latching Hall effect sensors 112*e*-1 through 112*e*-4.

The latching Hall effect sensors 112*e*-1 and 112*e*-3 are connected to the sensor comparator 128*e*-1 via Channels 1 and 2, respectively, which are also denoted as 130*e* collectively. Similarly, the latching Hall effect sensors 112*e*-2 and 112*e*-4 are connected to the sensor comparator 128*e*-2 via Channels 1 and 2, respectively, which are also denoted as 130*e* collectively.

In FIG. 5A, the contactless switch assembly 100*e* is in the open circuit position and the latching Hall effect sensors 112*e*-1 and 112*e*-3 detect the magnetic south pole of the permanent magnets 108*e*-2 and 108*e*-4, respectively, and the latching Hall effect sensors 112*e*-2 and 112*e*-4 detect the magnetic north pole of the permanent magnets 108*e*-3 and 108*e*-5, respectively. And in FIG. 5B, the contactless switch assembly 100*e* is in the closed circuit position and the latching Hall effect sensors 112*e*-1 and 112*e*-3 detect the magnetic north pole of the permanent magnets 108*e*-1 and 108*e*-3, respectively, and the latching Hall effect sensors 112*e*-2 and 112*e*-4 detect the magnetic south pole of the permanent magnets 108*e*-2 and 108*e*-4, respectively.

Each of the sensor comparators 128*e* determines a combined sense state 132*e* based upon a sensor comparator truth table and the states of the respective Channels 1 and 2. The combined sensor state 132e of each of the sensor comparators 128e are provided to the multi-channel switch controller 114e via input channels 116e.

An exemplary truth table for the sensor comparators 128e is shown in Table 5. In this embodiment, under normal conditions, the respective input states (Channel 1 and Channel 2) of one of the sensor comparators 128e are the same value and different from the input states of the other sensor comparator 128e. Thus, because the inputs to the sensor comparator such as 128e-1 are the same, the sensor comparator 128e-1 cannot determine whether the latching Hall effect sensors 112e-1 and 112e-3 are being swamped by an external magnetic field or measuring the magnetic south poles (or north poles) of the permanent magnets 108e-2 and 108e-4 (108e-1 and 108e-3). In this embodiment, for one of the sensor comparators 128e, if the state of Channel 1 is different from the state of Channel 2 then one of the latching Hall effect sensors 112e coupled to that sensor comparator is malfunctioning. In some embodiments, the sensor comparator table may include input Channel states such as (0,1) and (1,0) for diagnostic purposes, and similarly, the combined sensor state 132 may include values to indicate an error and/or malfunction.

TABLE 5

Truth table for sensor comparators of FIGS. 5A and 5B

| | Input | | Combined Sensor (CS) |
|---|---|---|---|
| | Channel 1 | Channel 2 | State 132 |
| 1 | 0 (1) | 0 (1) | 0 (1) |
| 2 | 1 (0) | 1 (0) | 1 (0) |

Values enclosed in parentheses are for the sensor comparator 128e-2.

The multi-channel switch controller 114e generates the switch state indicator 124e and the switch error level indicator 126 based upon a switch state truth table and the combined sensor states 132e received via Channels A and B, i.e, based upon the states of Channels A and B. Table 6 is an exemplary switch state truth table that the multi-channel switch controller 114e may implement.

TABLE 6

Switch Truth Table for 2-channel switch controller 114e

| | Channel A | Channel B | Switch State Indicator 124 | Switch Error Level Indicator 126 |
|---|---|---|---|---|
| 1 | 0 | 0 | SS = x | E = $E_1$ |
| 2 | 0 | 1 | SS = 0 | E = $E_0$ |
| 3 | 1 | 0 | SS = 1 | E = $E_0$ |
| 4 | 1 | 1 | SS = x | E = $E_1$ |

Table 6 is based upon the configuration of the permanent magnets 108e and the sensor comparator truth table as shown in Table 5. Here, row 2 represents the switch module 20 in open circuit position under normal operating conditions, and row 3 represents the switch module 20 in closed circuit position under normal operating conditions. Rows 1 and 4 correspond to when all of the latching Hall effect sensors 112e detect a south magnetic pole and a north magnetic pole, respectively. The various switch state indicators 124 and various switch error level indicators 126 may be used for diagnostic purposes.

Figure 6A:
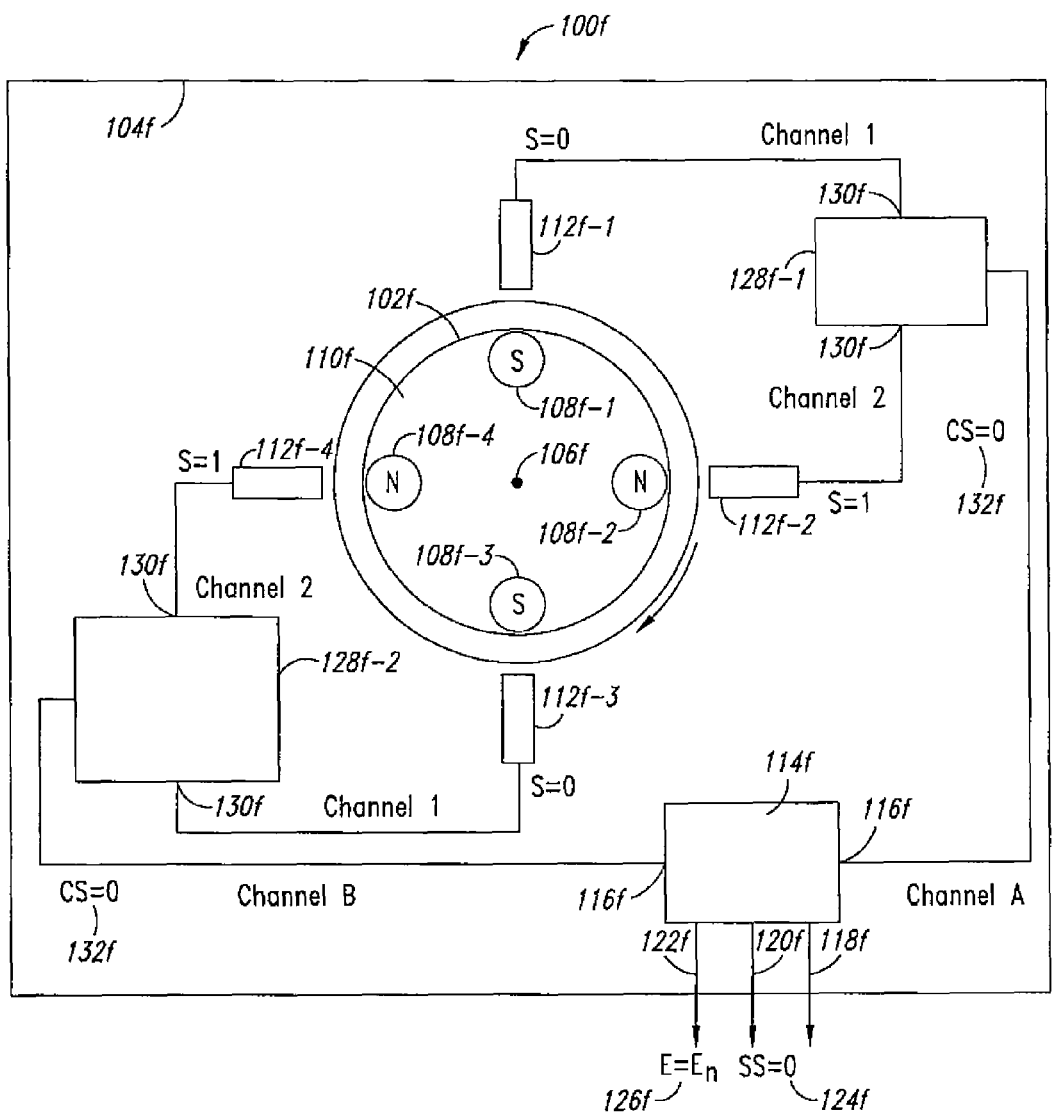
FIGS. 6A and 6B are block diagrams of a contactless switch assembly in open circuit position and closed circuit positions, respectively, according to a sixth illustrated embodiment.
Figure 6B:
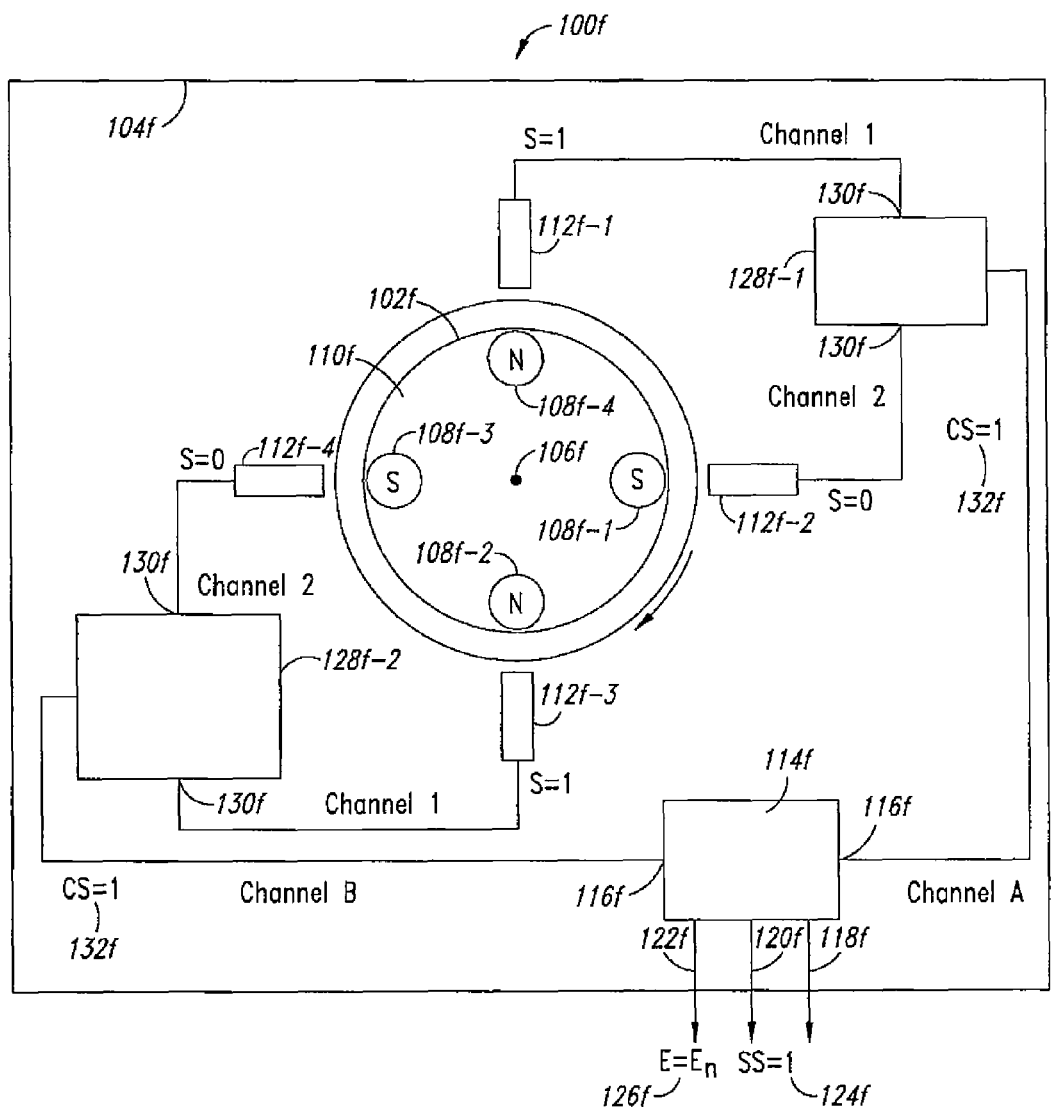

FIGS. 6A and 6B show a sixth embodiment of the contactless switch assembly 100f. In this embodiment, the elements and features labeled with a reference number and the letter "f" correspond to features and components that are similar at least in some respects to previously described having the same reference numeral and the letter "a," "b," "c," "d," or "e."

In FIG. 6A, the contactless switch assembly 100f is shown in its open circuit position and in FIG. 6B the contactless switch assembly 100f is shown in its closed circuit position.

In this embodiment, the relative motion between the magnet carrier 102f and the sensor holder 104f is rotational about the rotational axis 106f. In this exemplary embodiment, the magnet carrier 102f carries four permanent magnets 108f-1 through 108f-4 on or embedded in the surface 110f. Here, each actuation rotates the magnet carrier 102f by 90° about the rotational axis 106f. In other embodiments, the sensor holder 104f may rotate incrementally about the rotational axis 106f by 90°, and in other embodiments, both the magnet carrier 102f and the sensor holder 104f may rotate such that the combined angular displacement is 90°. In some embodiments, the rotation may alternate between clockwise and counterclockwise as the switch is moved back and forth between the open and closed circuit positions. In yet other embodiments, the rotation may be in one direction such as clockwise or counterclockwise as the switch is moved back and forth between the open and closed circuit positions.

In its open circuit position as shown in FIG. 6A, the diametrically opposed first pair of latching Hall effect sensors 112f-1 and 112f-3 detect the magnetic south pole of the permanent magnets 108f-1 and 108f-3, respectively. Similarly, when the contactless switch assembly 100f is in its open circuit position, the diametrically opposed second pair of latching Hall effect sensors 112f-2 and 112f-4 detect the magnetic north pole of the permanent magnets 108f-2 and 108f-4, respectively. As illustrated, the first pair of latching Hall effect sensors 112f-1, 112f-3 are positioned perpendicular with respect to the second pair of latching Hall effect sensors 112f-2, 112f-4.

In response to the user actuating the actuator 24 the magnet carrier 102f rotates 90°. FIG. 6B shows the rotation as being clockwise, but the rotation may be counter clockwise. In FIG. 6B, the contactless switch assembly 100f is in the closed circuit position with latching Hall effect sensors 112f-1 and 112f-3 detecting the magnetic north pole of the permanent magnets 108f-4 and 108f-2, respectively, and latching Hall effect sensors 112f-2 and 112f-4 detecting the magnetic south pole of the permanent magnets 108f-1 and 108f-3, respectively.

The sensor comparator 128f-1 is coupled to the latching Hall effect sensors 112f-1 and 112f-2 via input Channels 1 and 2, respectively, which are collectively referenced as 130f. Similarly, the sensor comparator 128f-2 is connected to the latching Hall effect sensors 112f-3 and 112f-4 via the input Channels 1 and 2, which are collectively referenced as input Channels 130f. The sensor comparators 128f may use a sensor comparator truth table such as Table 3 and the state of their respective input Channels 1 and 2 to determine the combined sensor state 132f.

The multi-channel switch controller 114f is connected to the sensor comparators 128f via two input channels, individually referenced as Channel A and Channel B and collectively referenced as input Channels 116f. The multi-channel switch controller 114f may implement a multi-channel controller truth logic such as Table 4 for finding the switch state indicator 124f and the switch level indicator 126f.

Figure 7A:
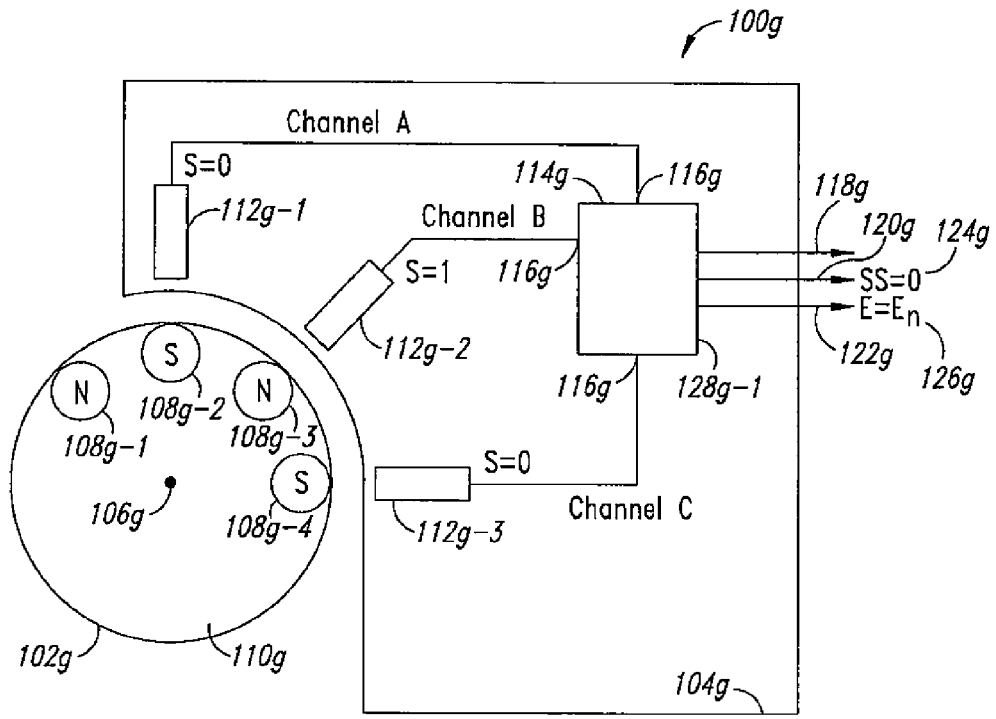
FIGS. 7A and 7B are block diagrams of a contactless switch assembly in open circuit position and closed circuit positions, respectively, according to a seventh illustrated embodiment.
Figure 7B:
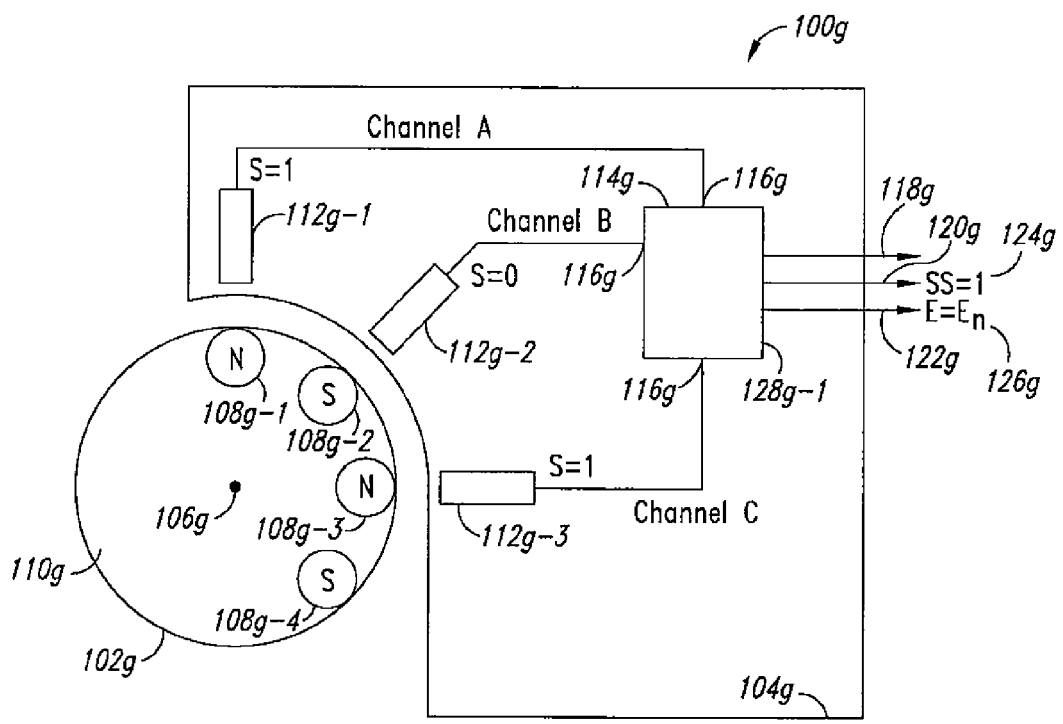

FIGS. 7A and 7B show a seventh embodiment of the contactless switch assembly 100g in its open circuit and closed circuit positions, respectively. In FIGS. 7A and 7B, various components and features are labeled with a reference number and the letter "g." Such features and elements correspond at least in some aspects to previously described features and elements having the same reference numeral and the letter "a," "b," "c," "d," "e," or "f."

In the seventh embodiment as shown in FIGS. 7A and 7B, the magnet carrier 102g carries four permanent magnets 108g-1 through 108g-4. The permanent magnets 108g are distributed on or in the magnet carrier 102g such that adjacent permanent magnets have a uniform angular separation such as 45° as measured relative to the rotational axis 106g. Similarly, the latching Hall effect sensors 112g-1 through 112g-3 are distributed on or in the sensor holder 104g such that they have a uniform angular separation such as 45° between adjacent latching Hall effect sensors 112g as measured relative to the rotational axis 106g. It should be noted that in other embodiments the permanent magnets 108g can be distributed with a different angular separation and the latching Hall effect sensors 112g would be distributed to correspond. For example, the angular separation between adjacent permanent magnets 108g could be 15° or 30° or 60°.

In FIG. 7A, the latching Hall effect sensors 112g-1 and 112g-3 detect the magnetic south pole of the permanent magnets 108g-2 and 108g-4, respectively, and the latching Hall effect sensor 112g-2 detects the magnetic north pole of the permanent magnet 108g-3.

In response to the user actuating the actuator 24, the magnet carrier 102g incrementally rotates (e.g., 45° clockwise or counterclockwise). FIG. 7B shows the contactless switch assembly 100g in the closed circuit position with latching Hall effect sensors 112g-1 and 112g-3 detecting the magnetic north poles of the permanent magnets 108g-1 and 108g-3, respectively, and the latching Hall effect sensor 112g-2 detecting the magnetic south pole of the permanent magnet 108g-2. In response to the user actuating the actuator 24 again, the magnet carrier 102g incrementally rotates (e.g., 45° clockwise or counterclockwise).

The multi-channel switch controller 114g has three input channels, individually referenced as Channels A-C and collectively referenced as 116g. The multi-channel switch controller 114g may use a truth table such as Table 7 for finding the switch state indicator 124g and the switch level indicator 126g.

TABLE 7

Switch Truth Table for 3-channel switch controller 114g

| | Channel A | Channel B | Channel C | Switch State Indicator 124 | Switch Error Level Indicator 126 |
|---|---|---|---|---|---|
| 1 | 0 | 0 | 0 | SS = x | E = $E_1$ |
| 2 | 0 | 1 | 0 | SS = 0 | E = $E_0$ |
| 3 | 1 | 0 | 1 | SS = 1 | E = $E_0$ |
| 4 | 1 | 1 | 1 | SS = x | E = $E_1$ |

Figure 8A:
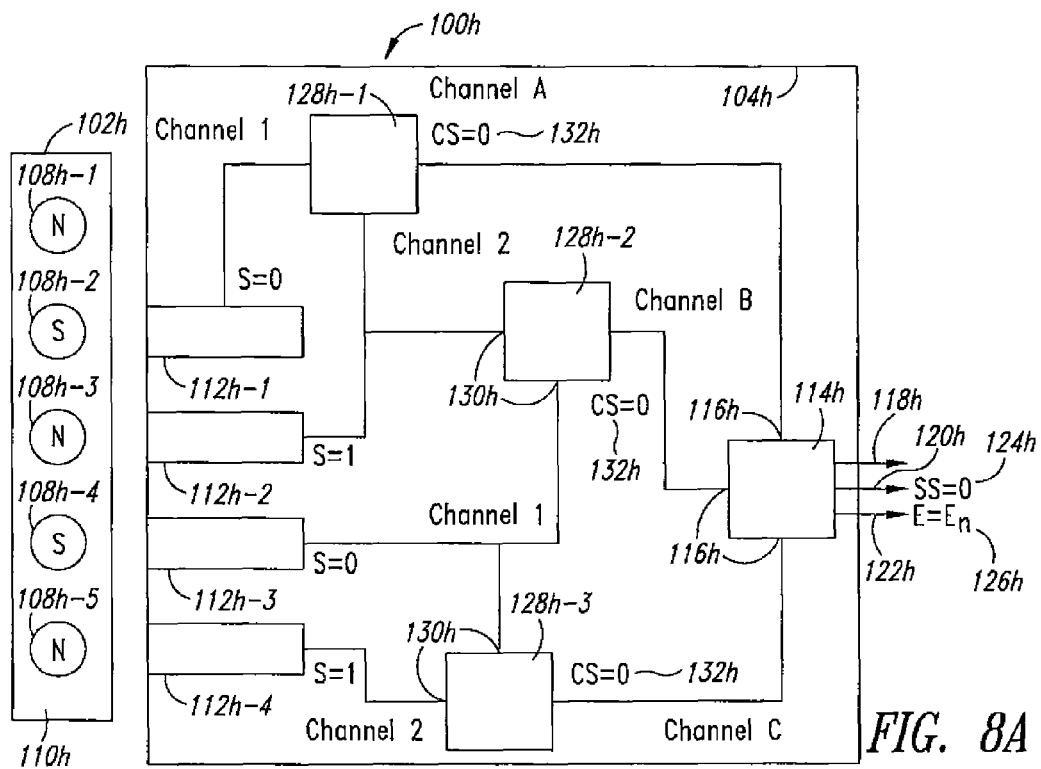
FIGS. 8A and 8B are block diagrams of a contactless switch assembly in open circuit position and closed circuit positions, respectively, according to a eighth illustrated embodiment.
Figure 8B:
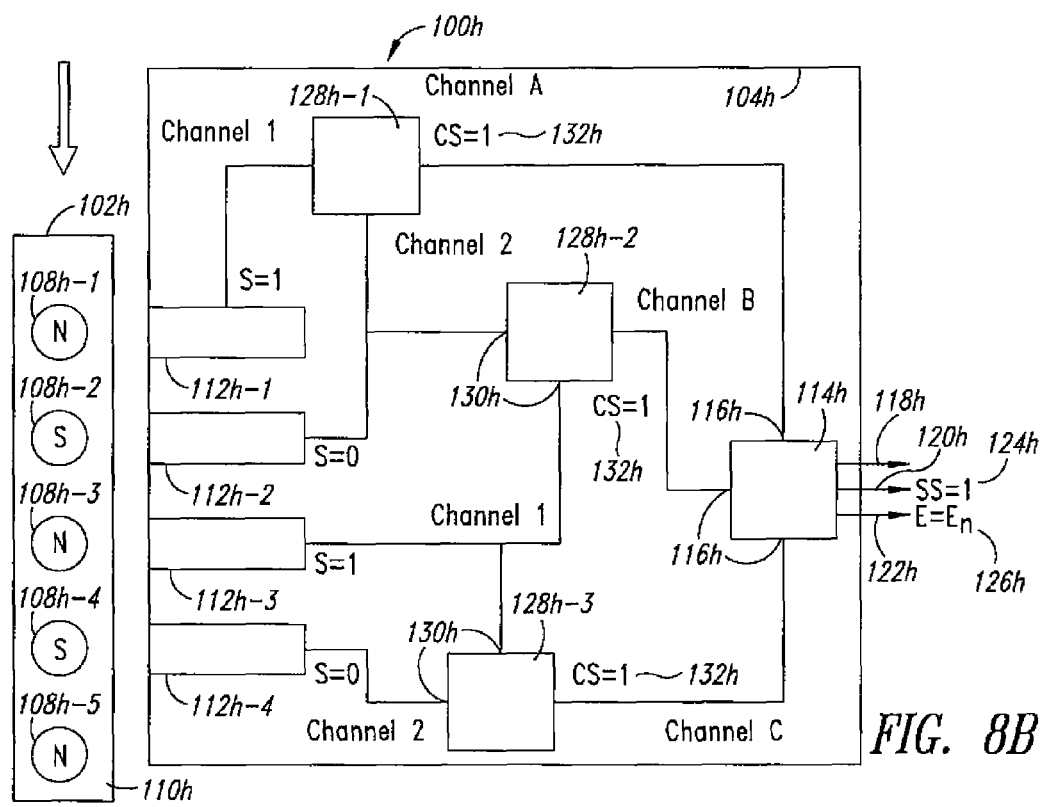

FIGS. 8A and 8B show an eighth embodiment of the contactless switch assembly 100h in its open circuit and closed circuit positions, respectively. In FIGS. 8A and 8B, various components and features are labeled with a reference number and the letter "h." Such features and elements correspond in at least some respects to previously described features and elements having the same reference numeral and the letter "a," "b," "c," "d," "e," "f," or "g."

In the eighth embodiment as shown in FIGS. 8A and 8B, the magnet carrier 102h carries five permanent magnets 108h-1 through 108h-5. The permanent magnets 108h are distributed on or in the magnet carrier 102h such that adjacent permanent magnets have opposite magnetic poles exposed and such that a separation distance (d1) between adjacent permanent magnets is approximately uniform. Similarly, the latching Hall effect sensors 112h-1 through 112h-4 are distributed on or in the sensor holder 104h such that a separation distance (d2) between adjacent permanent latching Hall effect sensors is approximately uniform, where a separation distance d2 is approximately equal to a separation distance d1.

In this embodiment, there are three sensor comparators 128h-1 through 128h-3, each having two respective inputs, individually referenced as Channel 1 and Channel 2 and collectively referenced as 130h. Channels 1 and 2 of the sensor comparator 128h-1 are coupled to the latching Hall effect sensors 112h-1 and 112h-2, respectively. Channels 1 and 2 of the sensor comparator 128h-2 are coupled to the latching Hall effect sensors 112h-3 and 112h-2, respectively. Channels 1 and 2 of the sensor comparator 128h-3 are coupled to the latching Hall effect sensors 112h-3 and 112h-4, respectively. Each one of the sensor comparators 128h determines a combined sensor state 132h based upon the respective states of Channels 1 and 2 and based upon a sensor comparator truth table such as Table 3.

In FIG. 8A, the latching Hall effect sensors 112h-1 and 112h-3 detect the magnetic south pole of the permanent magnets 108h-2 and 108h-4, respectively, and the latching Hall effect sensors 112h-2 and 112h-4 detect the magnetic north pole of the permanent magnets 108h-3 and 108h-5, respectively. Thus, based upon a comparator truth table such as Table 3, the combined sensor states 132h for the sensor comparators 128h-1 and 128h-3 are CS=0.

In response to the user actuating the actuator 24, the magnet carrier 102h translates relative to the sensor holder 104h by approximately a separation distance d1. In response to the user actuating the actuator 24 again, the magnet carrier 102h translates by approximately a separation distance d1 back to the configuration shown in FIG. 8A.

FIG. 8B shows the contactless switch assembly 100h in the closed circuit position with latching Hall effect sensors 112h-1 and 112h-3 detecting the magnetic north pole of the permanent magnets 108h-1 through 108h-3, respectively, and the latching Hall effect sensors 112h-2 and 112h-4 detecting the magnetic south pole of the permanent magnets 108h-2 and 108h-4, respectively. Thus, based upon a comparator truth table such as Table 3, the combined sensor states 132h for the sensor comparators 128h-1 through 128h-3 are CS=1.

The multi-Channel switch controller 114h has three input channels, individually referenced as Channels A-C and collectively referenced as 116h. The multi-channel switch controller 114h may use a multi-channel controller truth table such as truth Table 8 for finding the switch state indicator 124h and the switch level indicator 126h.

TABLE 8

Truth table for multi-channel switch controller of FIGS. 8A and 8B

| | 1 | 2 | 3 | 4 | Channel A | Channel B | Channel C | Switch State Indicator 124 | Switch Error Level Indicator 126 |
|---|---|---|---|---|---|---|---|---|---|
| 1 | 0 | 0 | 0 | 0 | e_ss | e_ss | e_ss | SS = x | E = $E_3(s)$ |
| 2 | 0 | 0 | 0 | 1 | e_ss | e_ss | 0 | SS = 0 | E = $E_2(2)$ |
| 3 | 0 | 0 | 1 | 0 | e_ss | 1 | 1 | SS = 1 | E = $E_1(1)$ |

TABLE 8-continued

Truth table for multi-channel switch controller of FIGS. 8A and 8B

| | 1 | 2 | 3 | 4 | Channel A | Channel B | Channel C | Switch State Indicator 124 | Switch Error Level Indicator 126 |
|---|---|---|---|---|---|---|---|---|---|
| 4 | 0 | 0 | 1 | 1 | e_ss | 1 | e_nn | SS = x | E = $E_3$(?) |
| 5 | 0 | 1 | 0 | 0 | 0 | 0 | e_ss | SS = 0 | E = $E_1$(4) |
| 6 | 0 | 1 | 0 | 1 | 0 | 0 | 0 | SS = 0 | E = $E_0$ |
| 7 | 0 | 1 | 1 | 0 | 0 | e_nn | 1 | SS = x | E = $E_3$(?) |
| 8 | 0 | 1 | 1 | 1 | 0 | e_nn | e_nn | SS = 0 | E = $E_2$(3) |
| 9 | 1 | 0 | 0 | 0 | 1 | e_ss | e_ss | SS = 1 | E = $E_2$(3) |
| 10 | 1 | 0 | 0 | 1 | 1 | e_ss | 0 | SS = x | E = $E_3$(?) |
| 11 | 1 | 0 | 1 | 0 | 1 | 1 | 1 | SS = 1 | E = $E_0$ |
| 12 | 1 | 0 | 1 | 1 | 1 | 1 | e_nn | SS = 1 | E = $E_1$(4) |
| 13 | 1 | 1 | 0 | 0 | e_nn | 0 | e_ss | SS = x | E = $E_3$(?) |
| 14 | 1 | 1 | 0 | 1 | e_nn | 0 | 0 | SS = 0 | E = $E_1$(1) |
| 15 | 1 | 1 | 1 | 0 | e_nn | e_nn | 1 | SS = 1 | E = $E_2$(2) |
| 16 | 1 | 1 | 1 | 1 | e_nn | e_nn | e_nn | SS = x | E = $E_3$(n) | e_nn is error state from a sensor comparator that detects magnetic north poles at both of it latching Hall effect sensors; e_ss is error state from a sensor comparator that detects magnetic south poles at both of it latching Hall effect sensors.

In Table 8, columns labeled 1-4 show the possible sensor states of the four latching Hall effect sensors 112h-1 through 112h-4, respectively. The next three columns, which are labeled as Channel A, Channel B, and Channel C, show the state of the respective input channels for all possible sensor states. The last two columns show the switch state indicator 124 and the switch error level indicator 126 for each of the possible sensor states. Error level indicators 126 are given as E=$E_n$(y), where n equals the number of channels in which there is an error (0, 1, 2, or 3), and y represents a presumed fault. For example, referring to row 16 (or row 1), when y=n (or s), the presumed fault is that all of the latching Hall effect sensors 112h are being swamped by an external magnetic field that corresponds to a magnetic north pole (or a magnetic south pole). When y is a number, the number represents a presumed error with the corresponding numbered latching Hall effect sensor. For example, if n=2, then it is presumed that the latching Hall effect sensor 112h-2 is malfunctioning. The presumption for determining which latching Hall effect sensor 112h is malfunctioning is based upon the configuration of the embodiment shown in FIGS. 8A and 8B. Some errors cannot be resolved such as when the state of each respective input channel is different from the state of all of the other input channels. In that case, the switch error level indicator is denoted as $E_3$(?).

Rows 6 and 11 represent the contactless switch assembly 100f in the open and closed circuit positions, respectively, under normal operating conditions, having switch state indicators 124 with values 0 and 1, respectively. In some embodiments, when there is an error in one of the input channels 116h and there is a presumed resolution of the error such as latching Hall effect sensor 112_n is malfunctioning, then the switch state indicator 124 is set to the value of one of the other input channels that does not have an error state.

For example, assume that the switch 24 is in the open position as shown in FIG. 8A and that all components are operating normally. In that case, the latching Hall effect sensors have outputs shown in the first four columns of row 6 of Table 8. The input channels 116h of the multi-channel switch controller 114 are each in the "0" state, and the switch state indicator 124h has the value of "0". Next, assume that the latching Hall effect sensor 112h-3 malfunctions and becomes locked in the state S=1, then the states of the latching Hall effect sensors 112h would be that shown in the first 4 columns at row 8. Note that input Channel A remains in the state "0" as does the switch state indicator 124h, but due to the malfunction of latching Hall effect sensor 112h-3, the sensor comparators 128h-2 and 128h-3 report error states of e_nn. Next assume that switch 24 is actuated and the latching Hall effect sensor 112h-3 is still locked in the state S=1. Then, the states of the latching Hall effect sensors 112h would be that shown in the first 4 columns at row 11, and the switch state indicator 124 for that situation is set to "1."

Table 9 shows a second exemplary truth table that may be implemented by the multi-switch controller 114h. Table 9 might be used in embodiments where the sensor comparators 128h provide combined sensor states consisting of 0 and 1, regardless of the input states of the sensor comparators.

TABLE 9

Truth table for multi-channel switch controller of FIGS. 8A and 8B

| | Channel A | Channel B | Channel C | Switch State Indicator 124 | Switch Error Level Indicator 126 |
|---|---|---|---|---|---|
| 1 | 0 | 0 | 0 | SS = 0 | E = $E_0$ |
| 2 | 0 | 0 | 1 | SS = 0 | E = $E_1$(C) |
| 3 | 0 | 1 | 0 | SS = 0 | E = $E_1$(B) |
| 4 | 0 | 1 | 1 | SS = 1 | E = $E_1$(A) |
| 5 | 1 | 0 | 0 | SS = 0 | E = $E_1$(A) |
| 6 | 1 | 0 | 1 | SS = 0 | E = $E_1$(B) |
| 7 | 1 | 1 | 0 | SS = 1 | E = $E_1$(B) |
| 8 | 1 | 1 | 1 | SS = 1 | E = $E_0$ |

The multi-channel switch controller 114h finds that state of each of the input channels 116h and sets the switch state indicator 124h based upon the states of the input channels 116h. Here, it is presumed that the state of the switch matches the state the majority of the input channels. The switch error level indicator 126 might include a fault channel indicator that corresponds to the channel that is presumed to be malfunctioning, if any.

Figure 9A:
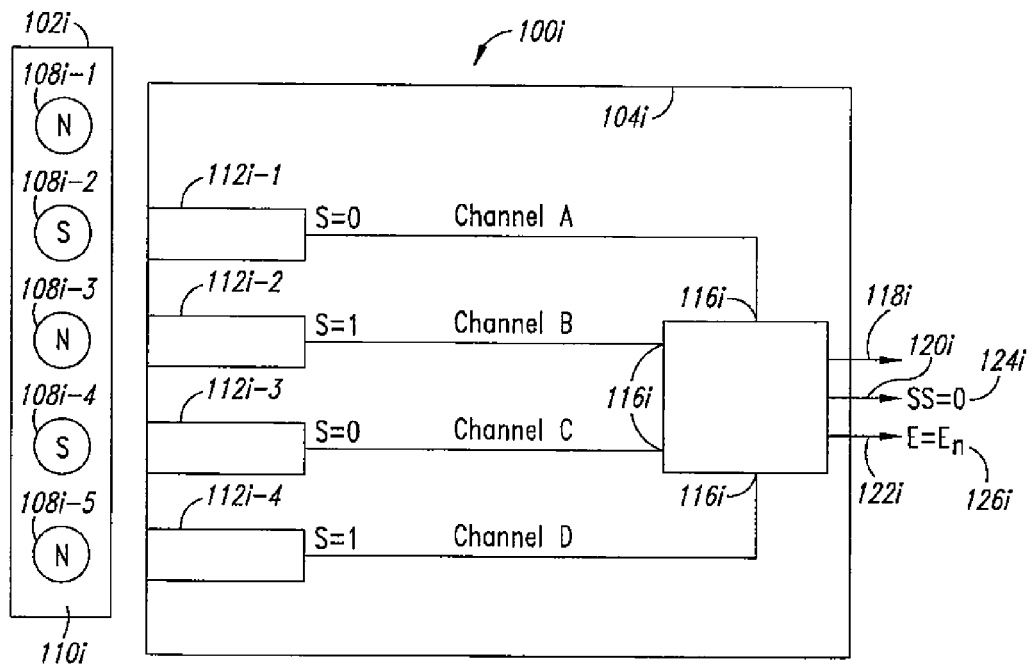
FIGS. 9A and 9B are block diagrams of a contactless switch assembly in open circuit position and closed circuit positions, respectively, according to a ninth illustrated embodiment.
Figure 9B:
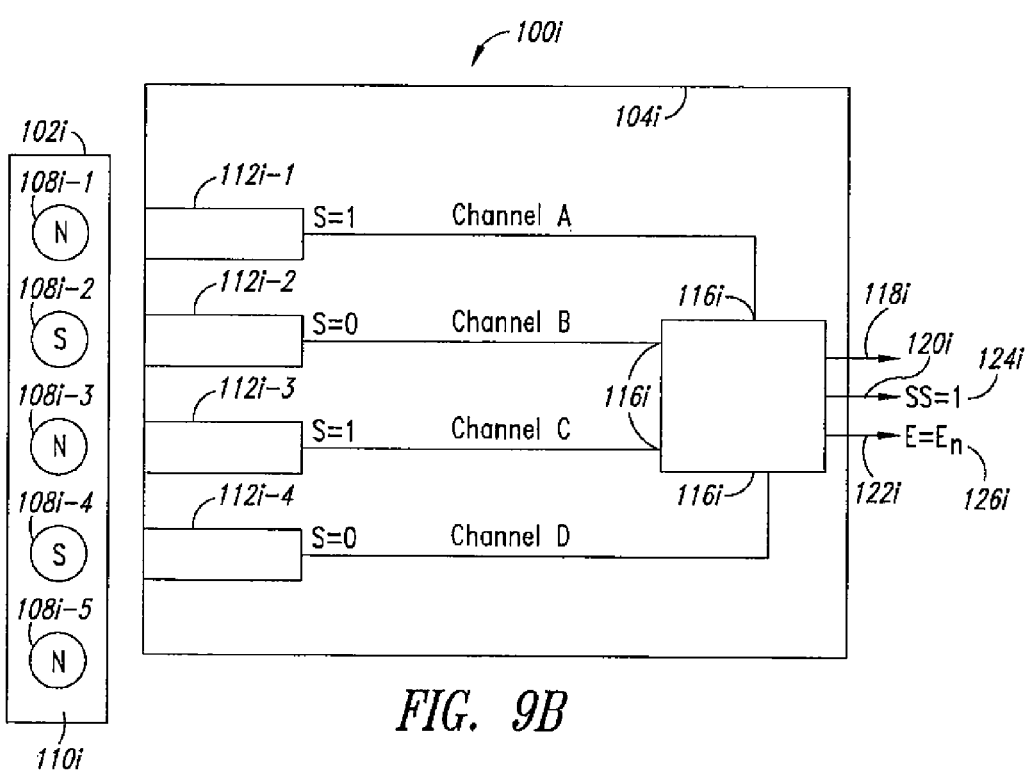

FIGS. 9A and 9B show a ninth embodiment of the contactless switch assembly 100i in its open circuit and closed circuit positions, respectively. In FIGS. 9A and 9B, various components and features are labeled with a reference number and the letter "i." Such features and elements correspond in at least some respect to previously described features and elements having the same reference numeral and the letter "a," "b," "c," "d," "e," "f," "g," or "h."

In the ninth embodiment as shown in FIGS. 9A and 9B, the magnet carrier 102i carries five permanent magnets 108i-1 through 108i-5. The permanent magnets 108i are distributed on or in the magnet carrier 102i such that adjacent permanent magnets have opposite magnetic poles exposed and such that the separation distance (d1) between adjacent permanent magnets is approximately uniform. Similarly, the latching Hall effect sensors 112i-1 through 112i-4 are distributed on or in the sensor holder 104i such that the separation distance (d2) between adjacent permanent latching Hall effect sensors is approximately uniform, where the separation distance d2 is approximately equal to the separation distance d1. Each one of the latching Hall effect sensors 112i are coupled to an input channel, individually referenced as Channels A-D and collectively referenced as channels 116i, of the multi-channel switch controller 114i.

In FIG. 9A, the latching Hall effect sensors 112i-1 and 112i-3 detect the magnetic south pole of the permanent magnets 108i-2 and 108i-4, respectively, and the latching Hall effect sensors 112i-2 and 112i-4 detect the magnetic north pole of the permanent magnets 108i-3 and 108i-5, respectively. Thus, the states of input Channels A-D of the multi-channel switch controller 114i are 0, 1, 0, and 1, respectively.

In response to the user actuating the actuator 24, the magnet carrier 102i translates relative to the sensor holder 104i by approximately the separation distance d1. In response to the user actuating the actuator 24 again, the magnet carrier 102i translates by approximately separation distance d1 back to the configuration shown in FIG. 9A.

FIG. 9B shows the contactless switch assembly 100i in the closed circuit position with latching Hall effect sensors 112i-1 and 112i-3 detecting the magnetic north pole of the permanent magnets 108i-1 and 108i-3, respectively, and the latching Hall effect sensors 112i-2 and 112i-4 detecting the magnetic south pole of the permanent magnets 108i-2 and 108i-4, respectively. Thus, the states of input Channels A-D of the multi-channel switch controller 114i are 1, 0, 1, and 0, respectively.

The multi-channel switch controller 114i may use a multi-channel controller truth table such as Table 10 for finding the switch state indicator 124i and the switch level indicator 126i.

TABLE 10

Truth table for multi-channel switch controller of FIGS. 9A and 9B

| | A | B | B | D | Switch State Indicator 124 | Switch Error Level Indicator 126 |
|---|---|---|---|---|---|---|
| 1 | 0 | 0 | 0 | 0 | SS = x | E = $E_2(s)$ |
| 2 | 0 | 0 | 0 | 1 | SS = 0 | E = $E_1(2)$ |
| 3 | 0 | 0 | 1 | 0 | SS = 1 | E = $E_1(1)$ |
| 4 | 0 | 0 | 1 | 1 | SS = x | E = $E_2(?)$ |
| 5 | 0 | 1 | 0 | 0 | SS = 0 | E = $E_1(4)$ |
| 6 | 0 | 1 | 0 | 1 | SS = 0 | E = $E_0$ |
| 7 | 0 | 1 | 1 | 0 | SS = x | E = $E_2(?)$ |
| 8 | 0 | 1 | 1 | 1 | SS = 0 | E = $E_1(3)$ |
| 9 | 1 | 0 | 0 | 0 | SS = 1 | E = $E_1(3)$ |
| 10 | 1 | 0 | 0 | 1 | SS = x | E = $E_2(?)$ |
| 11 | 1 | 0 | 1 | 0 | SS = 1 | E = $E_0$ |
| 12 | 1 | 0 | 1 | 1 | SS = 1 | E = $E_1(4)$ |
| 13 | 1 | 1 | 0 | 0 | SS = x | E = $E_2(?)$ |
| 14 | 1 | 1 | 0 | 1 | SS = 0 | E = $E_1(1)$ |
| 15 | 1 | 1 | 1 | 0 | SS = 1 | E = $E_2(2)$ |
| 16 | 1 | 1 | 1 | 1 | SS = x | E = $E_2(n)$ |

In Table 10, columns labeled A-D show the states of Channels A-D, respectively. The last two columns show the switch state indicator 124 and the switch error level indicator 126 for each of the possible channel states. Error level indicators 126 are given as $E_n(y)$, where n equals the number of channels in which there is an error (0, 1, or 2), and y represents a presumed fault. For example, referring to 16 (or row 1), when y=n (or s), the presumed fault is that all of the latching Hall effect sensors 112i are being swamped by an external magnetic field that corresponds to a magnetic north pole (or a magnetic south pole). When y is a number, the number represents a presumed error with the corresponding numbered latching Hall effect sensor. For example, if y=3, then it is presumed that the latching Hall effect sensor 112i-3 is malfunctioning. The presumption for determining which latching Hall effect sensor 112i is malfunctioning is based upon the configuration of the embodiment shown in FIGS. 9A and 9B. Some errors cannot be resolved. In that case, the switch error level indicator is denoted as $E_2(?)$.

Rows 6 and 11 represent the contactless switch assembly 100i in the open and closed circuit positions, respectively, under normal operating conditions, having switch state indicators 124i with values 0 and 1, respectively. In some embodiments, when there is an error in one of the input channels 116i and there is a presumed resolution of the error such as latching Hall effect sensor 112__n is malfunctioning, then the switch state indicator 124 is set to the value of one of the input channels that does not have an error state. For example, in row 2, Channels A-C are in state S=0, and Channel D is in state S=1. Under normal operating conditions, the channel states in row 2 are impossible for the configuration of permanent magnets 108i and latching Hall effect sensors 112i shown in FIGS. 9A and 9B. However, if Channel B were in the state S=1, then the states of Channels A-D would correspond to the situation of the switch being in its open circuit position as shown in FIG. 9A. Thus, when there is an error in one of the channels, the presumed switch state and the presumed error are based upon the actual configuration of the contactless switch assembly 100i.

Figure 10:
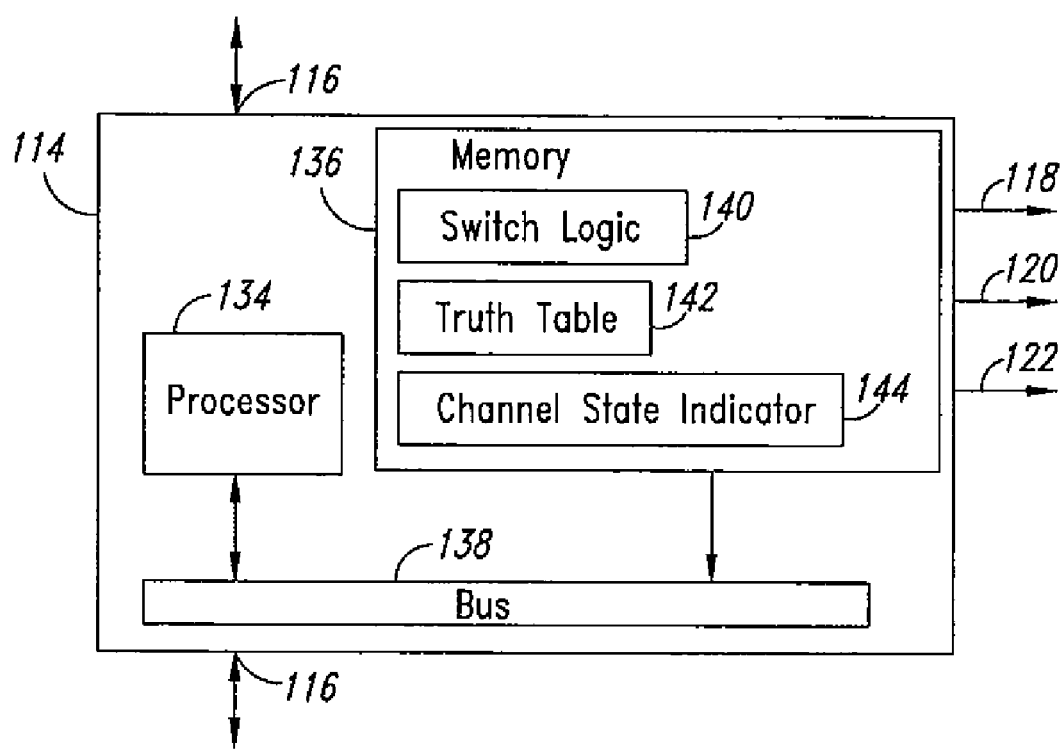
FIG. 10 is a block diagram of a multi-channel switch controller according to a one illustrated embodiment.

FIG. 10 shows an exemplary multi-channel switch controller 114, which may be implemented in the embodiments of FIGS. 1A-9B, previously described. In FIG. 10, various components and features are labeled with a reference number such as 114-126. Such features and elements correspond in at least some respects to previously described features and elements having the same reference numeral and the letter "a," "b," "c," "d," "e," "f," "g," "h," or "i."

The multi-channel switch controller 114 includes a number of input channels 116, a processor 134, and a memory 136. A bus 138 connects the processor 134 and memory 136. The memory 136 has switch state logic 140, truth table 142, and channel state indicator 144 stored therein. The processor 134 may execute the switch state logic 142 for, among other things, initializing the contactless switch assembly 100, and for finding the switch state indicator 124 and the switch level error indicator 126. The channel state indicator 144 may be, among other things, an array for storing states of each of the input channels 116 or an index for the truth table 142.

Figure 11:
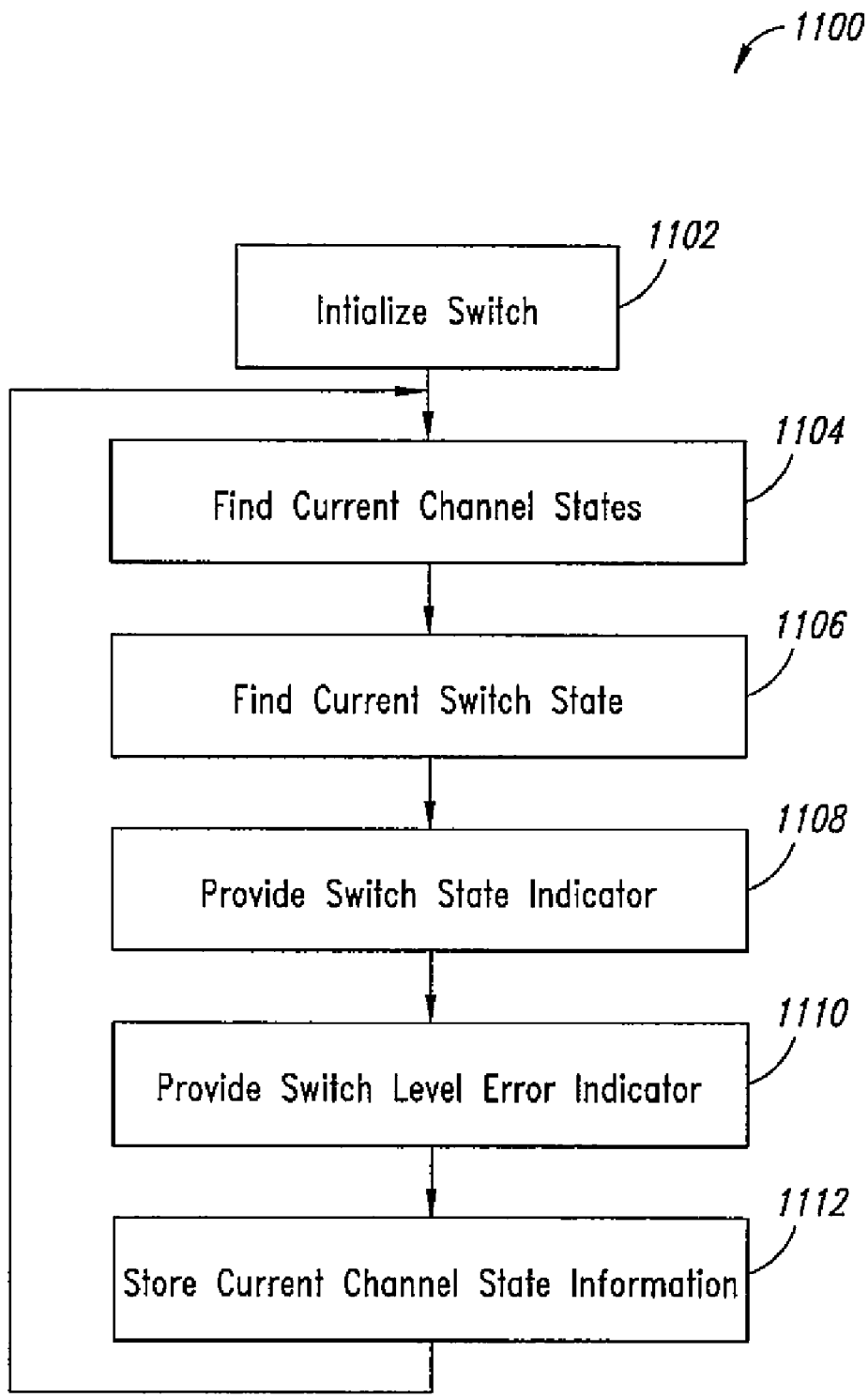
FIG. 11 is a flow diagram showing a first process to find a switch state according to one illustrated embodiment.

FIG. 11 shows an exemplary process 1100 that may be implemented by the multi-channel switch controller 114. At 1102, the contactless switch assembly 100 is initialized. During initialization, the processor 134 may interrogate devices coupled to the input channels 116 such as sensor comparators 128 and/or latching Hall effect sensors 112 to determine the respective states of the input channels 116. The processor 134 may determine the respective states of the input channels 116 by monitoring the voltage at each of the respective input channels. During initialization, the processor 134 may then store the states of the input channels in the channel state indicator 144 of the memory 136. In some embodiments, the processor 134 may determine a table index for the truth table 142 and store the table index in the channel state indicator 144.

In some embodiments, the state of the contactless switch assembly 100 is predetermined during initialization and, in such embodiments; the processor 124 may not need to interrogate the sensor comparators 128 and/or the latching Hall effect sensors 112. In such embodiments, the initial states of the sensor comparators 128 and/or the initial states of the latching Hall effect sensors 112 may be previously stored in the memory 136.

At 1104, the processor 134 finds the current states of the input channels 116. In some embodiments, the processor 134 may find the current channel states by periodically or intermittently interrogating devices such as sensor comparators 128 and/or the sensors 112 coupled to the input channels 116. The processor 134 may determine the respective states of the input channels 116 by monitoring the voltage at each of the respective input channels. In other embodiments, the devices coupled to the input channels 116 may send a message or signal that the processor 134 may use to find the state for each of the respective input channels 116.

At 1106, the processor 134 finds the current switch state of the contactless switch assembly 100. The processor 134 may use the truth table 142 and the current channel states to determine a switch state indicator 124 and may optionally determine a switch level error indicator 126 for the current channel states.

At 1108, the processor 134 provides the current switch state indicator 124 via the electrical connector 120.

At 1110, the processor 134 may provide the current switch error level indicator 126 via the electrical connector 122. Block 1110 is an optional part of the process 1100.

At 1112, the processor 134 stores current channel state information in the memory 136. The current channel state information may be an index to the truth table 142 or may be the states of input channels.

The process then returns to 1104 and repeats.

Figure 12:
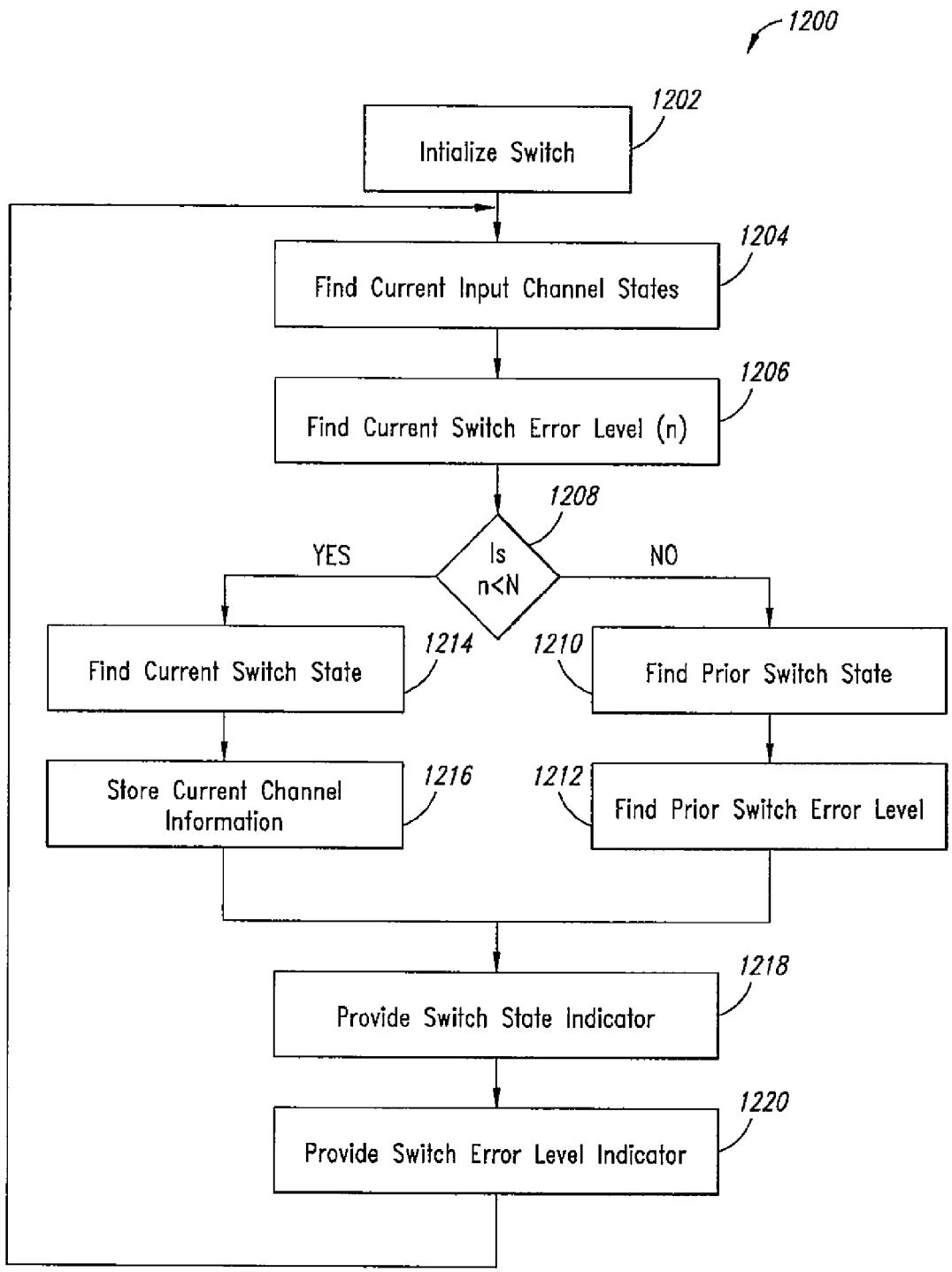
FIG. 12 is a flow diagram showing a second process to find a switch state according to one illustrated embodiment.

FIG. 12 shows an exemplary process 1200 that may be implemented by the multi-channel switch controller 114. At 1202, the contactless switch assembly 100 is initialized. During initialization, the processor 134 may interrogate devices coupled to the input channels 116 such as sensor comparators 128 and/or latching Hall effect sensors 112. The processor 134 may determine the respective states of the input channels 116 by monitoring the voltage at each of the respective input channels. During initialization, the processor 134 may then store the states of the input channels in the channel state indicator 144 of the memory 136. In some embodiments, the processor 134 may determine a table index for the truth table 142 and store the table index in the channel state indicator 144.

At 1204, the processor 134 finds the current states of the input channels 116. In some embodiments, the processor 134 may find the current channel states by periodically or intermittently interrogating devices such as sensor comparators 128 and/or the sensors 112 coupled to the input channels 116. The processor 134 may determine the respective states of the input channels 116 by monitoring the voltage at each of the respective input channels. In other embodiments, the devices coupled to the input channels 116 may send a message or signal that the processor 134 may use to find the state for each of the respective input channels 116.

At 1206, the processor 134 finds the current switch error level for the contactless switch assembly 100. The processor 134 may use the truth table 142 and the current channel states to determine a current switch error level, "n".

At 1208, the processor 134 determines whether the current switch error level "n" is less than or equal to a predetermined value "N".

If n is not less than N, the process continues at 1210, where the processor 134 finds the prior switch state. The processor 134 may use channel state indicator 144 and the truth table 142 to find the prior switch state. In some embodiments, the prior switch state may be stored in the memory 136.

At 1212, processor 134 finds the prior switch error level. The processor 134 may use channel state indicator 144 and the truth table 142 to find the prior switch error level. In some embodiments, the prior switch error level may be stored in the memory 136.

If n is less than N, the process continues at 1214, where the processor 134 finds the current switch state. The processor 134 may use the truth table 142 and current channel states to find the current switch state. At 1216, the processor 134 stores the current channel state information in the memory 136. The current channel state information may be an index to the truth table 142 or may be the states of input channels.

At 1218, the processor 134 provides a switch state indicator 124. If n is less than N, the switch state indicator corresponds to the current switch state and if not, the switch state indicator corresponds to the prior switch state.

At 1220, the processor 134 provides a switch level error indicator 126. If n is less than N, the switch level error indicator corresponds to the current switch level error and if not, the switch level error indicator corresponds to the prior switch level error.

As a non-limiting example, N may be equal to 1, 2, 3 or 4 such as in the embodiment described FIGS. 8A and 8B and Table 8. With a switch error level of zero, there may be a high degree or absolute confidence in the switch state, and with a switch error level of 1, there may be a high degree of confidence in the "presumed" switch state, as shown in Table 8. Whereas, with a switch error level of two, there may be a lower confidence of the "presumed" switch state, and with a switch error level of three, there may be no confidence of the switch state, as shown in Table 8. With N=1, the only switch state indicators 124 that are provided by the multi-channel switch controller 114 are those that are associated with switch error levels of zero.

Similarly, with N=3, the multi-channel switch controller 114 will provide switch level indicators 124 that correspond to rows 2, 3, 5, 6, 8, 9, 11, 12, 14 and 15 of Table 8, where there is a degree of confidence in the switch state. Thus, if the current switch error level found at 1206 has a value of 3, then the multi-channel switch controller 114 will provide the prior switch state indicator 124.

Naturally, N could also be set to 4, and in that case the multi-channel switch controller 114 will provide the current switch state indicator 124, regardless of the state of the switch is determinable.

The process then returns to 1204 and repeats.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The above description of shown embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art.

For example, while the specific embodiments were illustrated with three or four latching Hall effect sensors, in other embodiments, there may be more than four latching magnetic field sensing sensors. Also, while some of the specific embodiments were illustrated with a pair of sensor comparators, each sensor comparator coupled to a pair of latching Hall effect sensors, in other embodiments, there may be more than a pair of sensor comparators.

As another example, the specific embodiments were illustrated as having one or more permanent magnets with a magnetic north pole exposed from the magnet carrier and having one or more permanent magnets with a magnetic south pole exposed from the magnet carrier. However, in some embodiments, the permanent magnets having the same polarity (e.g., magnetic south pole) exposed from the magnet carrier may be omitted, and in that case, the latching magnetic field sensing sensors may be configured to switch upon detection of a magnetic field such as $\vec{B}_1 = \vec{B}_0$ and $\vec{B}_2 = 0$ or $\vec{B}_1 = \vec{B}_0$ and $\vec{B}_2 = \alpha \vec{B}_0$, where $\alpha$ is not equal to 1. In yet other embodiments, the permanent magnets may include two or more sets of permanent magnets, where each one of the permanent magnets in one set of permanent magnets produce approximately a first magnetic field, each one of the permanent magnets in the other set of permanent magnets produce approximately the a second magnetic field, and the magnitudes of the first and second magnetic fields are different. In that case, the latching magnetic field sensing sensors may be configured to switch upon detecting a first magnetic field at a first magnitude and detecting a second magnetic field at a second magnitude. In addition, the permanent magnets may be arranged to have the same magnetic pole exposed towards the latching magnetic field sensing sensors, and the latching magnetic field sensing sensors may be configured to switch upon detecting a first magnetic field at a first magnitude and detecting a second magnetic field at a second magnitude.

Furthermore, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that the mechanisms of taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

The invention claimed is:

1. A contactless switch module, comprising:
a plurality of magnets;
a plurality of latching magnetic field sensing sensors, wherein the plurality of magnetic field sensing sensors are each latching Hall effect sensors;
an actuator selectively operable to produce relative movement between the plurality of latching magnetic field sensing sensors and the plurality of magnets in response to manipulation by a user such that each of the latching magnetic field sensing sensors is proximal to a first respective one of the magnets when the actuator is in a first position and each of the latching magnetic field sensing sensors is proximal to a second respective one of the magnets when the actuator is in a second position, different from the first position; and
a multi-channel switch controller having a plurality of input channels, each one of the plurality of magnetic field sensing sensors communicatively coupled to at least one of the plurality of input channels, the multi-channel switch controller configured to determine a respective current channel state for each one of the input channels, the current channel states being related to current sensor states of the plurality of magnetic field sensing sensors, the multi-channel switch controller further configured to find a current switch state based at least upon the current channel states and a logic, wherein the plurality of input channels includes a first input channel coupled to a first one of the magnetic field sensing sensors, a second input channel coupled to a second one of the magnetic field sensing sensors, and a third input channel coupled to a third one of the magnetic field sensing sensors, wherein for each input channel, the channel state is the sensor state of the magnetic field sensing sensor coupled thereto, wherein when the actuator is in the first position, the respective channel state for the first input channel and the third input channel is either a high sensor state or a low sensor state and the channel state for the second input channel is either the low sensor state or the high sensor state but is not the same as the channel states of the first and third input channels, and wherein when the actuator is in the second position, the respective channel states for the first input channel, the second input channel, and the third input channel flip between the sensor states.

2. The contactless switch module of claim 1 wherein the plurality of magnets are each permanent magnets.

3. The contactless switch module of claim 1 wherein the logic comprises a table stored in a processor-readable memory.

4. The contactless switch module of claim 1, further comprising:
a magnet carrier carrying the plurality of magnets, the magnetic carrier coupled to the actuator motion and mounted for rotational movement with respect to the plurality of latching magnetic field sensing sensors.

5. The contactless switch module of claim 1, further comprising:
a magnet carrier carrying the plurality of magnets, the magnetic carrier coupled to the actuator and mounted for translational movement with respect to the plurality of latching magnetic field sensing sensors.

6. The contactless switch module of claim 1, further comprising:
a housing receiving the plurality of magnets, the plurality of latching magnetic field sensing sensors, the actuator, and the multi-channel switch controller.

7. A contactless switch module, comprising:
a plurality of magnets;
a plurality of latching magnetic field sensing sensors, wherein the plurality of magnetic field sensing sensors are each latching Hall effect sensors;
an actuator selectively operable to produce relative movement between the plurality of latching magnetic field sensing sensors and the plurality of magnets in response to manipulation by a user such that each of the latching magnetic field sensing sensors is proximal to a first respective one of the magnets when the actuator is in a first position and each of the latching magnetic field sensing sensors is proximal to a second respective one of the magnets when the actuator is in a second position, different from the first position; and
a multi-channel switch controller having a plurality of input channels, each one of the plurality of magnetic field sensing sensors communicatively coupled to at least one of the plurality of input channels, the multi-channel switch controller configured to determine a respective current channel state for each one of the input channels, the current channel states being related to current sensor states of the plurality of magnetic field sensing sensors, the multi-channel switch controller further configured to find a current switch state based at least upon the current channel states and a logic, wherein the plurality of magnetic field sensing sensors includes a first set of magnetic field sensing sensors and a second set of magnetic field sensing sensors, each one of the first set of magnetic field sensing sensors communicatively coupled to one of a first number of input channels of the multi-channel switch controller, and each one of the second set of magnetic field sensing sensors communicatively coupled to one of a second number of input channels of the multi-channel switch controller, each one of the first set of magnetic field sensing sensors detect a magnetic north pole of one of the magnets when the actuator is in the first position and detect a magnetic south pole when the actuator is in the second position, and each one of the second set of magnetic field sensing sensors detect a magnetic south pole of one of the permanent magnets when the actuator is in the first position and detect a magnetic north pole when the actuator is in the second position, wherein the current channel state of each of the input channels flips when the actuator is actuated between the second position and the first position.

8. A contactless switch module, comprising:
a plurality of magnets;
a plurality of latching magnetic field sensing sensors, wherein the plurality of magnetic field sensing sensors are each latching Hall effect sensors;
an actuator selectively operable to produce relative movement between the plurality of latching magnetic field sensing sensors and the plurality of magnets in response to manipulation by a user such that each of the latching magnetic field sensing sensors is proximal to a first respective one of the magnets when the actuator is in a first position and each of the latching magnetic field sensing sensors is proximal to a second respective one of the magnets when the actuator is in a second position, different from the first position;
a multi-channel switch controller having a plurality of input channels, each one of the plurality of magnetic field sensing sensors communicatively coupled to at least one of the plurality of input channels, the multi-channel switch controller configured to determine a respective current channel state for each one of the input channels, the current channel states being related to current sensor states of the plurality of magnetic field sensing sensors, the multi-channel switch controller further configured to find a current switch state based at least upon the current channel states and a logic;
a first sensor comparator coupled to a first one of the magnetic field sensing sensors at a first input channel and coupled to a second one of the magnetic field sensing sensors at a second input channel, the first sensor comparator configured to find a first combined sensor state based at least upon the current sensor states of the first one of the magnetic field sensing sensors and the second one of the magnetic field sensing sensors and provide the first combined sensor state to the multi-channel switch controller via a first input channel of the multi-channel switch controller, and wherein the channel state of the first input channel of the multi-channel switch controller is the first combined sensor state; and
a second sensor comparator coupled to a third one of the magnetic field sensing sensors at a first input channel and coupled to a fourth one of the magnetic field sensing sensors at a second input channel, the second sensor comparator configured to find a second combined sensor state based at least upon the current sensor states of the third one of the magnetic field sensing sensors and the fourth one of the magnetic field sensing sensors and provide the second combined sensor state to the multi-channel switch controller via a second input channel of the multi-channel switch controller, and wherein the channel state of the second input channel of the multi-channel switch controller is the second combined sensor state.

9. The contactless switch module of claim 8 wherein the first combined sensor state and the second combined sensor state is one of either high or low, and when the actuator is in the first position both the first combined sensor state and the second combined sensor state are in the same state, and when the actuator is in the second position both the first combined sensor state and the second combined sensor state flip to the other state.

10. The contactless switch module of claim 8 wherein the first combined sensor state and the second combined sensor state is one of either high or low, wherein when the actuator is in the first position the first combined sensor state is the low state and second combined sensor state is the high state, and when the actuator is in the second position both the first combined sensor state and the second combined sensor state flip to the respective other state.

11. The contactless switch module of claim 8, further comprising:
a magnet carrier carrying the plurality of magnets and mounted for rotational movement with respect to the plurality of latching magnetic field sensing sensors; and
a mechanical drive assembly coupled to provide relative rotation between the magnet carrier and the plurality of latching magnetic field sensing sensors in response to manipulation of the actuator.

12. The contactless switch module of claim 11 wherein the number of magnets is N and the relative rotation is in increments of 90 degrees.

13. The contactless switch module of claim 11 wherein the number of magnets n is greater than four and the relative rotation is in increments at least approximately equal to 360 degrees divided by n.

14. The contactless switch module of claim 8, further comprising:
a magnet carrier carrying the plurality of magnets, the magnetic carrier coupled to the actuator and mounted for translational movement with respect to the plurality of latching magnetic field sensing sensors; and
a mechanical drive assembly coupled to provide relative translation between the magnet carrier and the plurality of latching magnetic field sensing sensors in response to manipulation of the actuator.

15. The contactless switch module of claim 14 wherein the plurality of magnets includes a first, a second, a third, a fourth, and a fifth permanent magnet, and when the actuator is in the first position, each of the four latching Hall effect sensors are proximal to a first respective one of the first, the second, the third, or the fourth permanent magnets, and when the actuator is in the second position, the first latching Hall effect sensor is proximal to the fifth permanent magnet, and each of the second, the third, the fourth latching Hall effect sensors are proximal to a second respective one of the first, the second, and the third permanent magnets.

16. A contactless switch module, comprising:
an actuator selectively operable to produce relative movement between a plurality of latching magnetic field sensing sensors and a plurality of magnets in response to manipulation by a user such that each of the latching magnetic field sensing sensors is proximal to a first respective one of the magnets when the actuator is in a first position and each of the latching magnetic field sensing sensors is proximal to a second respective one of the magnets when the actuator is in a second position, different from the first position;
a plurality of sensor comparators having a plurality of input channels, each of the plurality of latching magnetic field sensing sensors communicatively coupled to at least one input channel of at least one sensor comparator, each sensor comparator configured to determine a respective current sensor state for each one of the input channels, and each sensor comparator further configured to find a current combined state based at least upon the current sensor states and a first logic; and
a multi-channel switch controller having a plurality of input channels, each one of the sensor comparators communicatively coupled to at least one of the plurality of input channels, the multi-channel switch controller configured to determine a respective current channel state for each one of the input channels, the current channel states being related to current combined states of the plurality of sensor comparators, the multi-channel switch controller further configured to find a current switch state based at least upon the current channel states and a second logic.

17. The contactless switch module of claim 16, further including:
a housing receiving the plurality of magnets, the plurality of latching magnetic field sensing sensors, the plurality of sensor comparators, the actuator, and the multi-channel switch controller.

18. The contactless switch module of claim 17, further including:
a magnet carrier carrying the plurality of magnets and coupled to the actuator, wherein the magnet carrier moves rotationally with respect to the housing.

19. The contactless switch module of claim 16 wherein the number of magnets equals the number of latching magnetic field sensing sensors.

20. The contactless switch module of claim 16 wherein the number of permanent magnets is at least one more than the number of latching magnetic field sensing sensors.

21. The contactless switch module of claim 16 wherein multi-channel switch controller is configured to find a current channel level error based at least upon information from each of the plurality of sensor comparators and provide a switch level error indicator related to the current channel level error.

22. The contactless switch module of claim 16 wherein each one of the first sensor comparator and the second sensor comparator is configured to find a respective error indicator based at least upon the current respective sensor states and the respective second logic and provide the respective error indicator to the multi-channel switch controller.

23. A contactless switch module, comprising:
a first plurality of permanent magnets, each permanent magnet having a magnetic north pole and a magnetic south pole;
a magnet carrier carrying the first plurality of permanent magnets, each of the first plurality of permanent magnets arranged to have a magnetic pole exposed from the magnet carrier, wherein the magnetic polarity of each of the exposed magnetic poles is the same;
a first set of latching magnetic field sensing sensors;
a second set of latching magnetic field sensing sensors;
an actuator selectively operable to produce relative movement between the first and second sets of latching magnetic field sensing sensors and the magnet carrier in response to manipulation by a user such that each latching magnetic field sensing sensor of the first set of latching magnetic field sensors is proximal to a first respective one of the first plurality of magnets when the actuator is in a first position and each latching magnetic field sensing sensor of the second set of the latching magnetic field sensing sensors is proximal to a second respective one of the first plurality of magnets when the actuator is in a second position, different from the first position; and
a multi-channel switch controller having a plurality of input channels, each one of the plurality of magnetic field sensing sensors communicatively coupled to at least one of the plurality of input channels, the multi-channel switch controller configured to determine a respective current channel state for each one of the input channels, the current channel states being related to current sensor states of the first and second sets of magnetic field sensing sensors, the multi-channel switch controller further configured to find a current switch state based at least upon the current channel states and a first logic, wherein when the switch module is operating under normal conditions, each one of the first set of latching magnetic field sensors latches into a first sensor state upon the respective latching magnetic field sensor detecting the exposed magnetic pole of the first respective one of the first plurality of magnets proximal to the respective latching magnetic field sensor when the actuator is in the first position, each one of the first set of latching magnetic field sensors latches into a second sensor state when the actuator is in the second position, each one of the second set of latching magnetic field sensors latches into the second sensor state when the actuator is in the first position, and each one of the second set of latching magnetic field sensors latches into the first sensor state upon the respective latching magnetic field sensor detecting the exposed magnetic pole of the second respective one of the first plurality of magnets proximal to the respective latching magnetic field sensor when the actuator is in the second position, wherein the multi-channel switch controller is further configured to find a current switch error level based at least upon the current channel states and the first logic and configured to provide a switch error level indicator.

24. The contactless switch module of claim 23 wherein the first set of latching magnetic field sensors has an even number of latching magnetic field sensors, the first plurality of permanent magnets has an even number of permanent magnets, the number of permanent magnets and the number of latching magnetic field sensors in the first set of latching magnetic field sensors being the same, and the second set of latching magnetic field sensors has an odd number of latching magnetic field sensors.

25. The contactless switch module of claim 24, further including:
a second plurality of permanent magnets carried by the magnetic carrier, each permanent magnet having a magnetic north pole and a magnetic south pole, each of the second plurality of permanent magnets arranged to have a magnetic pole exposed from the magnet carrier, wherein the magnetic polarity of each of the exposed magnetic poles of the second plurality of permanent magnets is the same and opposite the polarity of the exposed magnetic poles of the first plurality of permanent magnets, wherein the second plurality of permanent magnets has an even number of permanent magnets, the number of permanent magnets in the second plurality of permanent magnets and the number of latching magnetic field sensors in the first set of latching magnetic field sensors being the same.

26. The contactless switch module of claim 24 wherein at least one of latching magnetic field sensor of either the first set of latching magnetic field sensors or the second set of latching magnetic field sensors is connected directly to the multi-channel switch controller.

27. The contactless switch module of claim 23, wherein the relative motion between the first set of latching magnetic field sensing sensors and the magnet carrier is rotational by an amount θ, where θ=360 degrees divided by N and N is equal to the first number.

28. A contactless switch module, comprising:
a first plurality of permanent magnets, each permanent magnet having a magnetic north pole and a magnetic south pole;
a magnet carrier carrying the first plurality of permanent magnets, each of the first plurality of permanent magnets arranged to have a magnetic pole exposed from the magnet carrier, wherein the magnetic polarity of each of the exposed magnetic poles is the same;
a first set of latching magnetic field sensing sensors;
a second set of latching magnetic field sensing sensors;
an actuator selectively operable to produce relative movement between the first and second sets of latching magnetic field sensing sensors and the magnet carrier in response to manipulation by a user such that each latching magnetic field sensing sensor of the first set of latching magnetic field sensors is proximal to a first respective one of the first plurality of magnets when the actuator is in a first position and each latching magnetic field sensing sensor of the second set of the latching magnetic field sensing sensors is proximal to a second respective one of the first plurality of magnets when the actuator is in a second position, different from the first position;
a multi-channel switch controller having a plurality of input channels, each one of the plurality of magnetic field sensing sensors communicatively coupled to at least one of the plurality of input channels, the multi-channel switch controller configured to determine a respective current channel state for each one of the input channels, the current channel states being related to current sensor states of the first and second sets of magnetic field sensing sensors, the multi-channel switch controller further configured to find a current switch state based at least upon the current channel states and a first logic, wherein when the switch module is operating under normal conditions, each one of the first set of latching magnetic field sensors latches into a first sensor state upon the respective latching magnetic field sensor detecting the exposed magnetic pole of the first respective one of the first plurality of magnets proximal to the respective latching magnetic field sensor when the actuator is in the first position, each one of the first set of latching magnetic field sensors latches into a second sensor state when the actuator is in the second position, each one of the second set of latching magnetic field sensors latches into the second sensor state when the actuator is in the first position, and each one of the second set of latching magnetic field sensors latches into the first sensor state upon the respective latching magnetic field sensor detecting the exposed magnetic pole of the second respective one of the first plurality of magnets proximal to the respective latching magnetic field sensor when the actuator is in the second position; and
a plurality of sensor comparators, each of the sensor comparators having at least a first input channel, a second input channel, and an output channel communicatively coupled to a respective one of the input channels of the multi-channel switch controller, wherein for each one of the plurality of sensor comparators, the respective first input channel is communicatively coupled to a respective first one of the first set of latching magnetic field sensing sensors and the respective second input channel is communicatively coupled to a respective second one of the second set of latching magnetic field sensing sensors, each one of the plurality of sensor comparators configured to determine the sensor states for the respective latching magnetic field sensing sensors communicatively coupled to the first and second input channels, and each one of the plurality of sensor comparators being further configured to find a respective current combined sensor state based at least upon the current respective sensor states and second logic, wherein the multi-channel switch controller uses at least the combined sensor states to find the current channel states.

29. The contactless switch module of claim 28 wherein each one of the plurality of sensor comparators is further configured to determine a fault condition based at least upon the current respective sensor states and the second logic and configured to provide a respective fault indicator to the multi-channel switch controller.

30. The contactless switch module of claim 28, wherein the first set of latching magnetic field sensors has a first number of latching magnetic field sensors, the first plurality of permanent magnets has a second number of permanent magnets, and the second set of latching magnetic field sensors has a third number of latching magnetic field sensors, wherein the first, the second, and the third numbers are the same number.

31. The contactless switch module of claim 30, further including:
a second plurality of permanent magnets carried by the magnetic carrier, each permanent magnet having a magnetic north pole and a magnetic south pole, each of the second plurality of permanent magnets arranged to have a magnetic pole exposed from the magnet carrier, wherein the magnetic polarity of each of the exposed magnetic poles of the second plurality of permanent magnets is the same and opposite the polarity of the exposed magnetic poles of the first plurality of permanent magnets, wherein the second plurality of permanent magnets has an fourth number of permanent magnets, the fourth number the same as the first number.

32. The contactless switch module of claim 30, further including:
a second plurality of permanent magnets carried by the magnetic carrier, each permanent magnet having a magnetic north pole and a magnetic south pole, each of the second plurality of permanent magnets arranged to have a magnetic pole exposed from the magnet carrier, wherein the magnetic polarity of each of the exposed magnetic poles of the second plurality of permanent magnets is the same and opposite the polarity of the exposed magnetic poles of the first plurality of permanent magnets, wherein the second plurality of permanent magnets has a fourth number of permanent magnets, the fourth number different from the first number.

33. The contactless switch module of claim 32, wherein the relative motion between the first set of latching magnetic field sensing sensors and the magnet carrier is translational.

34. The contactless switch module of claim 32, wherein the relative motion between the first set of latching magnetic field sensing sensors and the magnet carrier is rotational.

* * * * *